United States Patent
Kobayashi et al.

[11] Patent Number: 5,847,995
[45] Date of Patent: Dec. 8, 1998

[54] NONVOLATILE SEMICONDUCTOR MEMORY DEVICE HAVING A PLURALITY OF BLOCKS PROVIDED ON A PLURALITY OF ELECTRICALLY ISOLATED WELLS

[75] Inventors: Shinichi Kobayashi; Shinji Kawai; Tadashi Omae; Makoto Oi, all of Hyogo; Akinori Matsuo, Tokyo; Masashi Wada, Tokyo; Kenji Kozakai, Tokyo, all of Japan

[73] Assignee: Mitsubishi Denki Kabushiki Kaisha, Tokyo, Japan

[21] Appl. No.: 852,354

[22] Filed: May 7, 1997

[30] Foreign Application Priority Data

May 10, 1996 [JP] Japan ..................... 8-116481

[51] Int. Cl.$^6$ .................................... G11C 7/00
[52] U.S. Cl. ................ 365/185.18; 365/185.11; 365/185.27; 365/200; 365/230.03
[58] Field of Search .............. 365/185.18, 185.11, 365/185.27, 200, 189.09, 230.03

[56] References Cited

U.S. PATENT DOCUMENTS

| | | | |
|---|---|---|---|
| 5,477,499 | 12/1995 | Van Buskirk et al. | 365/185.13 |
| 5,561,620 | 10/1996 | Chen et al. | 365/185.26 |
| 5,621,690 | 4/1997 | Jungroth et al. | 365/185.13 |

FOREIGN PATENT DOCUMENTS

| | | |
|---|---|---|
| 3-290960 | 12/1991 | Japan . |
| 5-109292 | 4/1993 | Japan . |
| 5-151798 | 6/1993 | Japan . |

Primary Examiner—Vu A. Le
Attorney, Agent, or Firm—McDermott, Will & Emery

[57] ABSTRACT

The inventive DINOR flash memory includes a plurality of blocks, a spare block and a spare word line block, which are formed on a plurality of electrically isolated P-type wells. When a word line-to-well short-circuit takes place in a certain block and another block is selected, the block causing the word line-to-well short-circuit is brought into a non-selected state. Thus, no leakage takes place in the block causing the word line-to-well short-circuit, to exert no bad influence on the selected block.

12 Claims, 17 Drawing Sheets

| DEFECT MODE | RELIEVABLE? | RELIEVE METHOD OR DEFECT RANGE |
|---|---|---|
| FIRST DEFECT (WORD LINE-TO-WORD LINE SHORT) | O | REPLACE WITH SPARE WORD LINE |
| BIT DEFECT | O | REPLACE WITH SPARE WORD LINE |
| SECOND DEFECT (BIT LINE-TO-WORD LINE SHORT) | O | REPLACE WITH SPARE BLOCK |
| THIRD DEFECT (WORD LINE-TO-WELL SHORT) | X | CHIP DEFECT |

| DEFECT MODE | RELIEVABLE? | RELIEVE METHOD |
|---|---|---|
| FIRST DEFECT (WORD LINE-TO-WORD LINE SHORT) | O | REPLACE WITH SPARE WORD LINE |
| BIT DEFECT | O | REPLACE WITH SPARE WORD LINE |
| SECOND DEFECT (BIT LINE-TO-WORD LINE SHORT) | O | REPLACE WITH SPARE BLOCK |
| THIRD DEFECT (WORD LINE-TO-WELL SHORT) | O | REPLACE WITH SPARE BLOCK |

FIG.13

|  |  | REPLACED ADDRESS | | |
|---|---|---|---|---|
| SPARE BLOCK SELECTOR CIRCUIT | BLOCK ADDRESS PREDECODE SIGNAL | | X | X |
| SPARE WORD LINE SELECTOR CIRCUIT | BLOCK ADDRESS PREDECODE SIGNAL | X | | X |
| | WORD ADDRESS PREDECODE SIGNAL | Y | | Y |
| REPLACED STATE | | REPLACE DEFECTIVE WORD LINE | REPLACE DEFECTIVE BLOCK | REPLACE DEFECTIVE WORD LINE IN SPARE BLOCK |

| DEFECT MODE | RELIEVABLE? | RELIEVE METHOD OR DEFECT RANGE |
|---|---|---|
| FIRST DEFECT (WORD LINE-TO-WORD LINE SHORT) | O | REPLACE WITH SPARE WORD LINE |
| BIT DEFECT | O | REPLACE WITH SPARE WORD LINE |
| SECOND DEFECT (BIT LINE-TO-WORD LINE SHORT) | X | BLOCK DEFECT |
| THIRD DEFECT (WORD LINE-TO-WELL SHORT) | X | CHIP DEFECT |

# NONVOLATILE SEMICONDUCTOR MEMORY DEVICE HAVING A PLURALITY OF BLOCKS PROVIDED ON A PLURALITY OF ELECTRICALLY ISOLATED WELLS

BACKGROUND OF THE INVENTION

1. Field of the Invention

The present invention relates to a nonvolatile semiconductor memory device, and more particularly, it relates to a nonvolatile semiconductor memory device which can relieve defects.

2. Description of the Background Art

FIG. 14 is adapted to illustrate an erase method (operation) of a DINOR (divided bit line NOR) flash memory which is a conventional nonvolatile semiconductor memory device. FIG. 15 is adapted to illustrate a write method (operation) of the DINOR flash memory which is the conventional nonvolatile semiconductor memory device. Referring to FIGS. 14 and 15, memory cells of the DINOR flash memory comprise a P-type well 1, $N^+$ layers 9 for serving as drains which are formed on a surface of the P-type well 1, $N^+$ layers 11 for serving as sources which are formed on the surface of the P-type well 1, floating gates 15 which are formed on the P-type well 1 with a gate oxide films (not shown) interposed therebetween, and control gates 17 which are formed on the floating gates 15 with insulating films (not shown) interposed therebetween. The memory cells of such a structure are generally called stacked gate memory cells. The memory cells may alternatively be referred to as memory cell transistors.

A selector transistor comprises the P-type well 1, the $N^+$ layers 9 and 13 which are formed on the P-type well 1, and a selector gate 19 which is formed on the P-type well 1 with a gate oxide film (not shown) interposed therebetween. The P-type well 1 is formed on a surface of an N-type well 14 which is formed on a major surface of a P-type semiconductor substrate 16. Each of blocks BLK0 and BLK1 comprises two memory cells, one selector transistor, a main bit line MBL, and a subbit line SBL. FIGS. 14 and 15 illustrate two blocks BLK0 and BLK1 each including two memory cells, for convenience of illustration. In practice, however, three or more blocks are provided in plural, and each block includes three or more memory cells in plural.

Each memory cell has a two-layer gate structure, as hereinabove described. The gate oxide film provided under the first-layer floating gate 15 is a thin film of about 100 Å. Electrons are injected into the floating gate 15, for erasing data. On the other hand, electrons are extracted from the floating gate 15, for writing data. When electrons are injected into the floating gate 15, the memory cell transistor has a high threshold value and feeds no current. When electrons are extracted from the floating gate 15, on the other hand, the memory cell transistor has a low threshold value and feeds a current. A sense amplifier (not shown) reads this current difference as information of 1/0.

A bit line is divided into the main bit line MBL and the subbit line SBL. In other words, the selector transistor separates the main bit line MBL and the subbit line SBL from each other. Further, the selector transistor isolates the blocks BLK0 and BLK1 from each other.

With reference to FIG. 14, the erase method is described. Data are erased every block, and the block BLK0 is selected while the block BLK1 is in a non-selected state. A high voltage of about 12 V is applied to the control gates 17 of all memory cells of the selected block BLK0. In other words, a high voltage of about 12 V is applied to word lines (not shown) which are connected to the control gates 17 of all memory cells of the selected block BLK0. On the other hand, a negative voltage of about –11 V is applied to the $N^+$ layers 11 serving as sources of all memory cells of the selected block BLK0. A negative voltage of about –11 V is applied to the P-type well 1. Due to such application of the voltages, a high voltage of at least 20 V is applied across the word lines (the control gates 17) and the P-type well 1 in the memory cells of the selected block BLK0. Thus, electrons are injected into the floating gates 15 of the memory cells of the selected block BLK0 by a tunnel phenomenon.

On the other hand, the potentials of the control gates 17 of all memory cells of the non-selected block BLK1 are 0 V. In other words, the potentials of word lines (not shown) which are connected with the control gates 17 of all memory cells of the non-selected block BLK1 are 0 V. Further, the $N^+$ layers 11 serving as sources of all memory cells of the non-selected block BLK1 are 0 V. Therefore, no tunnel phenomenon takes place in the non-selected block BLK1. A voltage of –11 V is applied to the selector gate 19 of the selected block BLK0, while the potentials of the selector gate 19 of the non-selected block BLK1, the N-type well 14 and the P-type semiconductor substrate 16 are 0 V. The main bit line MBL is in a floating state.

Referring to FIG. 15, a voltage of 12 V is applied to the main bit line MBL in the selected block BLK0 as well as to the selector gate 19 of the selector transistor. In the selected block BLK0, further, a voltage of –11 V is applied to a selected word line. In other words, a voltage of –11 V is applied to the control gate 17 which is connected with the selected word line. Due to such application of the voltages, electrons tunnel from the floating gate 15 of the selected memory cell. In order to prevent extraction of electrons, the potential of the main bit line MBL may be set at 0 V. Thus, information of 1/0 can be stored.

FIG. 16 is a schematic block diagram showing the overall structure of the DINOR flash memory which is a conventional nonvolatile semiconductor memory device. Parts similar to those in FIG. 14 are denoted by the same reference numerals, to properly omit redundant description. Referring to FIG. 16, the conventional DINOR flash memory comprises a write/erase control circuit 87, source decoders 89 and 91, a selector gate decoder group 103, a data input/output buffer 93, a sense amplifier 95, a data driver 97, a Y gate 99, the blocks BLK0 and BLK1, a column latch circuit group 105, a well potential generator circuit 107, a Y decoder 121, an X decoder group 101, a high voltage generator circuit 109, a negative voltage generator circuit 111, switching circuits 113, 115, 117 and 119, an address buffer 20, and a verify voltage generator circuit 135.

The Y gate 99 comprises PMOS transistors 123 and 125, NMOS transistors 127 and 129, and inverters 131 and 133. The PMOS transistor 123 and the NMOS transistor 127 form a transfer gate. The transfer gate of such a structure is generally called a complementary (CMOS) transfer gate. This also applies to the PMOS transistor 125 and the NMOS transistor 129.

The blocks BLK0 and BLK1 are formed on the same P-type well 1. The blocks BLK0 and BLK1 comprise memory cells MC, selector transistors SG, word lines WL, subbit lines SBL and main bit lines MBL. The memory cells MC and the selector transistors SG are similar to the stacked gate memory cells and the selector transistors described with reference to FIG. 14.

The source decoder 89 is provided in correspondence to the block BLK0. The source decoder 91 is provided in correspondence to the block BLK1. The selector gate decoder group 103 comprises two selector gate decoders (not shown), which correspond to the two blocks BLK0 and BLK1 respectively. The X decoder group 101 comprises two X decoders (not shown), which correspond to the two blocks BLK0 and BLK1 respectively. The column latch circuit group 105 comprises two latch circuits (not shown), which correspond to the two main bit lines MBL respectively.

The control gates of the memory cells MC are connected with the word lines WL. Sources of the memory cells MC of the block BLK0 are connected with the source decoder 89. Sources of the memory cells MC of the block BLK1 are connected with the source decoder 91. Drains of the memory cells MC are connected with the subbit lines SBL. Selector gates of the selector transistors SG are connected with the selector gate decoder group 103. One sources/drains of the selector transistors SG are connected with the subbit lines SBL, while other sources/drains are connected with the main bit lines MBL. The column latch circuit group 105 is adapted to temporarily store write data for the memory cells MC. A data driver 97 provided on a column side inputs data into the column latch circuit group 105. The well potential generator circuit 107 controls the potential of the P-type well 1. The sense amplifier 95 reads data from the memory cells MC. The Y decoder 121 selects the main bit lines MBL. The verify voltage generator circuit 135 supplies a voltage (verify voltage) which is different from a normal read voltage to the word lines WL, in order to check whether or not electrons are extracted up to a prescribed threshold voltage when data are written in the memory cells MC.

The high voltage generator circuit 109 supplies a high voltage to the selector gate decoder group 103 and the column latch circuit group 105 when the switching circuit 113 is in an ON state. For example, the high voltage generator circuit 109 supplies a high voltage to the selector gate decoder group 103 in case of writing data in the memory cells MC. Further, the high voltage generator circuit 109 supplies a high voltage to the X decoder group 101 when the switching circuit 115 is turned on. For example, the high voltage generator circuit 109 supplies a high voltage to the X decoder group 101 in an erase operation. The negative voltage generator circuit 111 supplies a negative voltage to the well potential generator circuit 107, the source decoders 89 and 91 and the selector gate decoder group 103 when the switching circuit 117 is turned on. For example, the negative voltage generator circuit 111 supplies a negative voltage to the well potential generator circuit 107, the selector gate decoder group 103 and the source decoders 89 and 91 in erasing. Further, the negative voltage generator circuit 111 supplies a negative voltage to the X decoder group 101 when the switching circuit 119 is turned on. For example, the negative voltage generator circuit 111 supplies a negative voltage to the X decoder group 101 in case of writing data in the memory cells MC.

The write/erase control circuit 87 controls operations for writing and erasing data in and from the memory cells MC. The X decoder group 101 selects the word lines WL. The source decoder 89 supplies a negative voltage to the sources of the memory cell transistors MC when the block BLK0 is selected and data of the memory cells MC of the block BLK0 are erased. The source decoder 91 operates similarly to the source decoder 89. The selector gate decoder group 103 supplies the selector gates of the selector transistors SG of the selected block with a negative voltage in erasing and a high voltage in writing. FIG. 16 illustrates two blocks BLK0 and BLK1 and four memory cells MC included in each block, for convenience of illustration. In practice, however, three or more blocks are provided in plural, and five or more memory cells are included in each block in plural. Further, the numbers of the main bit lines, the subbit lines and the word lines are also increased in response to the number of the memory cells.

FIG. 17 illustrates the structure of the conventional DINOR flash memory provided with a block having a first defect (word line-to-word line short-circuit) in a selected state. Parts similar to those in FIG. 14 are denoted by the same reference numerals, to properly omit redundant description. FIG. 17 shows a state in erasing. Referring to FIG. 17, the control gates 17, which are connected with the word lines, are hereinafter referred to as word lines. The main bit line MBL and the $N^+$ layer 13 are connected with each other by a conductive layer which is formed in a contact hole 21. The subbit line SBL and the $N^+$ layers 9 are connected with each other through conductive layers which are formed in contact holes 21. Consider that adjacent word lines 17 are short-circuited, as shown by arrow a. Such a defect is referred to as a first defect. Despite the first defect, the potentials of the word lines 17 are not reduced but data can be correctly erased since all word lines 17 of the selected block are simultaneously selected, i.e., a voltage of 12 V is applied to all word lines 17 in the selected block in erasing. When one of the short-circuited word lines 17 is selected and supplied with a read voltage in reading, however, leakage takes place in the short-circuited portion since the other short-circuited word line 17 is in a non-selected state and its potential is 0 V. Thus, the potential of the selected word line 17 is reduced to cause defective reading. A similar phenomenon takes place also in writing. Such a first defect can be relieved by replacing the short-circuited two word lines 17 with two spare word lines. In erasing, channels 12 are formed in portions of the P-type well 1 located under all floating gates 15.

FIG. 18 shows the structure of the conventional DINOR flash memory provided with a block having a second defect (bit line-to-word line short-circuit) in a selected state. Parts similar to those in FIG. 17 are denoted by the same reference numerals, to properly omit redundant description.

Referring to FIG. 18, a word line 17 and the subbit line SBL are short-circuited through a contact hole 21, as shown by arrow a. Such a defect is referred to as a second defect. When such a second defect takes place, the potential of the short-circuit-circuited defective word line 17 is 0 V even if the defective word line 17 is brought into a non-selected state and a spare word line (not shown) is employed in erasing. Further, the potential of the back gate (the P-type well 1) is −11 V. Therefore, the memory cell transistors are in ON states, and channels 12 are formed. Therefore, a negative voltage (−11 V) propagates from the $N^+$ layer 11 serving as a source to the $N^+$ layers 9 serving as drains, and leakage results from the short-circuit across the word line 17 and the subbit line SBL. In other words, electrons leak from the $N^+$ layer 11 serving as a source to the word lines 17. The voltage of −11 V, which is supplied to the $N^+$ layer 11 serving as a source, is generated by a charge pump (the negative voltage generator circuit 111 shown in FIG. 16) and hence has small current suppliability. Therefore, the absolute value of the potential of the $N^+$ layer 11 serving as a source is reduced from |−11 V|, disadvantageously leading to defective erasing of the overall block including the second defect.

FIG. 19 illustrates the structure of the conventional DINOR flash memory provided with a block having a second defect (bit line-to-word line short-circuit) in a non-selected state. Parts similar to those in FIG. 18 are denoted by the same reference numerals, to properly omit redundant description. Referring to FIG. 19, the potentials of the selector gate 19, the N⁺ layer 11 serving as a source and the word lines 17 are 0 V when the block is in a non-selected state. Therefore, no leakage takes place although the non-selected block has the second defect (bit line-to-word line short-circuit). In other words, no leakage takes place, to exert no bad influence on the remaining normal block when the block having the second defect is brought into a non-selected state.

FIG. 20 illustrates the structure of the conventional DINOR flash memory provided with a block having a third defect (word line-to-well short-circuit) in a selected state. Parts similar to those in FIG. 17 are denoted by the same reference numerals, to properly omit redundant description. Referring to FIG. 20, one of the word lines 17 and the P-type well 1 are short-circuited, as shown by arrow a. This defect is referred to as a third defect. Even if the short-circuited defective word line 17 is brought into a non-selected state and a spare word line (not shown) is employed in an erase operation in the block including the third defect, the potentials of the defective word line 17 and the P-type well 1 are 0 V and −11 V respectively. Therefore, leakage takes place across the word line 17 and the P-type well 1. The voltage of 31 11 V, which is supplied to the P-type well 1, is generated by a charge pump (the negative voltage generator circuit 111 shown in FIG. 16), and hence the current suppliability is small. Therefore, the absolute value of the potential of the P-type well 1 is reduced from |−11 V|, disadvantageously leading to defective erasing of the overall block including the third defect.

FIG. 21 illustrates the structure of the conventional DINOR flash memory provided with a block having a third defect (word line-to-well short-circuit) in a non-selected state. Parts similar to those in FIG. 20 are denoted by the same reference numerals, to properly omit redundant description. Referring to FIG. 21, the potentials of the defective word line 17 and the P-type well 1 are 0 V and −11 V respectively even if the block having the third defect is brought into a non-selected state. Therefore, leakage takes place across the word line 17 and the P-type well 1. In other words, the leakage still remains and the remaining normal block is also brought into a defective state even if the block having the third defect is brought into a non-selected state. This is because all blocks are formed on the same P-type well 1. If the third defect is present, therefore, the overall chip is disadvantageously brought into a defective state.

FIG. 22 is a schematic block diagram showing a principal part of the conventional DINOR flash memory. Referring to FIG. 22, the principal part of the conventional DINOR flash memory includes blocks BLK0 to BLKn, a spare word line block SWB, a well potential generator circuit 7, SG/SL decoders 2 and 3, and X decoders 5 and 6. The blocks BLK0 to BLKn and the spare word line block SWB are formed on the same P-type well 1. The blocks BLK0 to BLKn are similar to the block BLK0 shown in FIG. 16. The spare word line block SWB is also similar to the block BLK0 shown in FIG. 16. However, the spare word line block SWB has a smaller number of word lines (not shown) than the block BLK0, and a smaller number of memory cells in response thereto. The word lines of the spare word line block SWB are referred to as "spare word lines".

The X decoders 5 and 6 are similar to the X decoders (not shown) included in the X decoder group 101 shown in FIG. 16. The X decoder 6 is provided for the spare word line block SWB. The SG/SL decoders 2 and 3 include selector gate decoders (not shown) and source decoders (not shown). The source decoders included in the SG/SL decoders 2 and 3 are similar to the source decoder 89 shown in FIG. 16, and the selector gate decoders are similar to the selector gate decoders (not shown) included in the selector gate decoder group 103 shown in FIG. 16. The SG/SL decoder 2 is provided for the spare word line block SWB. The well potential generator circuit 7 is similar to the well potential generator circuit 107 shown in FIG. 16.

FIG. 23 is adapted to illustrate defect relieve methods in the conventional DINOR flash memory and limits thereof. Referring to FIGS. 22 and 23, a first defect (word line-to-word line short-circuit) or a bit defect can be relieved by employing the spare word line block SWB in the conventional DINOR flash memory shown in FIG. 22. In other words, the first defect or the bit defect can be relieved by replacing the defective word line with a spare word line. The term "bit defect" indicates a defect of a single memory cell. However, a second defect (bit line-word line short-circuit) and a third defect (word line-well short-circuit) cannot be relieved with the spare word line block SWB (spare word lines). As herein above described, the block is brought into a defective state when the second defect takes place, while the chip is brought into a defective state when the third defect takes place, despite a short-circuit in a single portion. The conventional DINOR flash memory cannot relieve such defect of the block or the chip, and hence the production yield is reduced to disadvantageously increase the chip cost.

SUMMARY OF THE INVENTION

The present invention has been proposed in order to solve the aforementioned problems, and an object thereof is to provide a nonvolatile semiconductor memory device which can relieve a defect in a block or a chip.

Another object of the present invention is to provide a nonvolatile semiconductor memory device which can improve the production yield and prevent increase of the chip cost.

The nonvolatile semiconductor memory device according to the present invention comprises a plurality of blocks and block selection circuit. Each of the plurality of blocks includes a plurality of stacked gate memory cells. The block selection circuit selects a block in accordance with a block selection address. The plurality of blocks are formed on a plurality of first conductivity type wells which are electrically isolated from each other. The nonvolatile semiconductor memory device further comprises well selection circuit and source selection circuit. The well selection circuit is responsive to the operation mode to supply a voltage to the well provided with the block which is selected by the block selection circuit. The source selection circuit is responsive to the operation mode to supply a voltage to sources of the memory cells included in the block which is selected by the block selection circuit.

Thus, the nonvolatile semiconductor memory device according to the present invention has divided wells, and brings only a selected block into a selected state. Namely, non-selected blocks are brought into non-selected states. Even if a word line-to-well short-circuit takes place, therefore, no leakage is caused and the chip can be prevented from entering a defective state. Consequently, the nonvolatile semiconductor memory device according to the present invention can improve the production yield, thereby preventing increase of the chip cost.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 13 is adapted to illustrate the manners of replacement for relieving defects in the DINOR flash memory according to the embodiment 3 of the present invention;

DESCRIPTION OF THE PREFERRED EMBODIMENTS

DINOR flash memories which are exemplary nonvolatile semiconductor memory devices according to the present invention are now described with reference to the drawings.

(Embodiment 1)

A DINOR flash memory according to an embodiment 1 of the present invention can relieve a second defect (bit line-to-word line short-circuit). The overall structure of the DINOR flash memory according to the embodiment 1 is similar to that shown in FIG. 16.

Figures 1, 2:
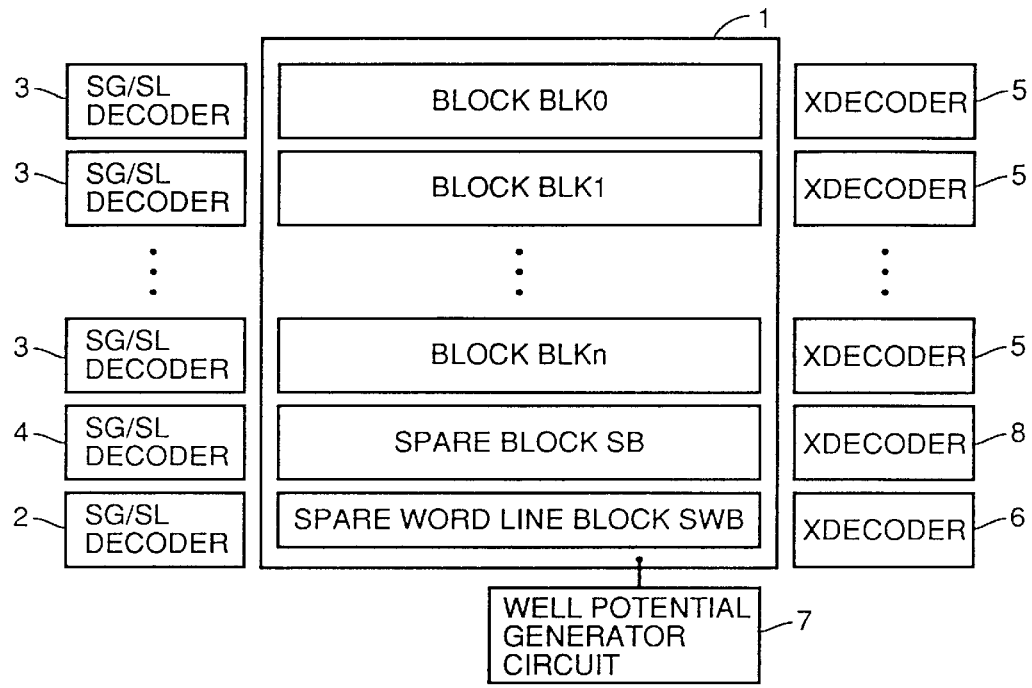
FIG. 1 is a schematic block diagram showing a principal part of a DINOR flash memory according to an embodiment 1 of the present invention.
FIG. 2 is adapted to illustrate methods of relieving defects in the DINOR flash memory according to the embodiment 1 of the present invention.

FIG. 1 is a schematic block diagram showing a principal part of the DINOR flash memory according to the embodiment 1. Referring to FIG. 1, the DINOR flash memory according to the embodiment 1 includes blocks BLK0 to BLKn, a spare block SB, a spare word line block SWB, SG/SL decoders 2, 3 and 4, X decoders 5, 6 and 8, and a well potential generator circuit 7. The blocks BLK0 to BLKn, the spare block SB and the spare word line block SWB are formed on the same P-type well 1.

Figure 16:
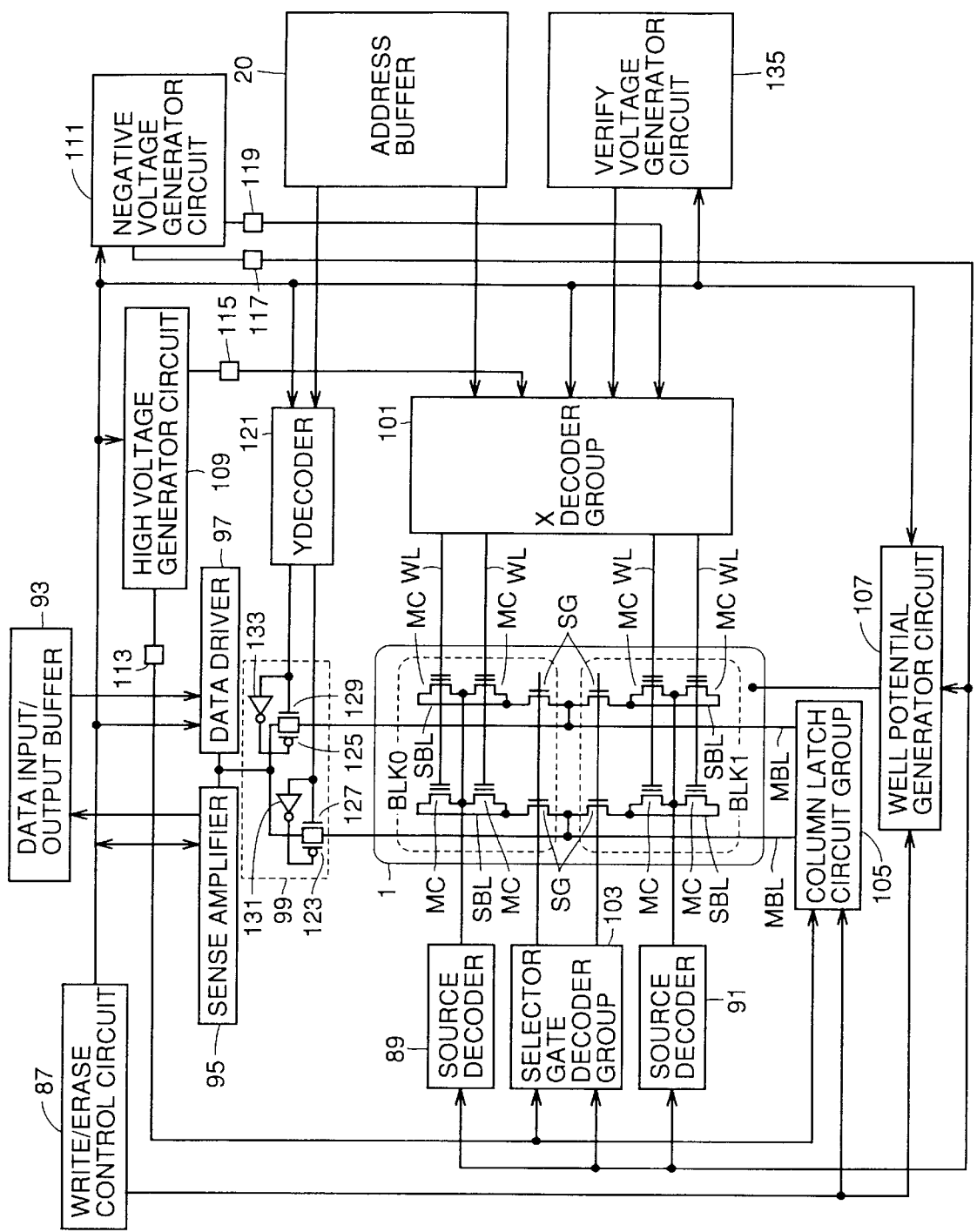
FIG. 16 is a schematic block diagram showing the overall structure of the conventional DINOR flash memory.
Figure 17:
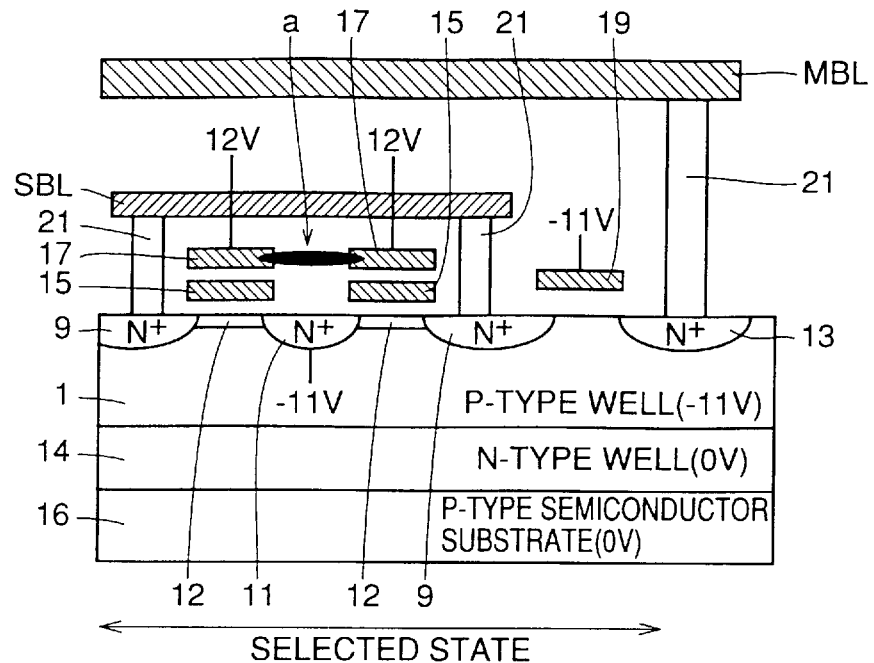
FIG. 17 shows the structure of the conventional DINOR flash memory provided with a block having a first defect (word line-to-word line short-circuit) which is brought into a selected state.
Figure 18:
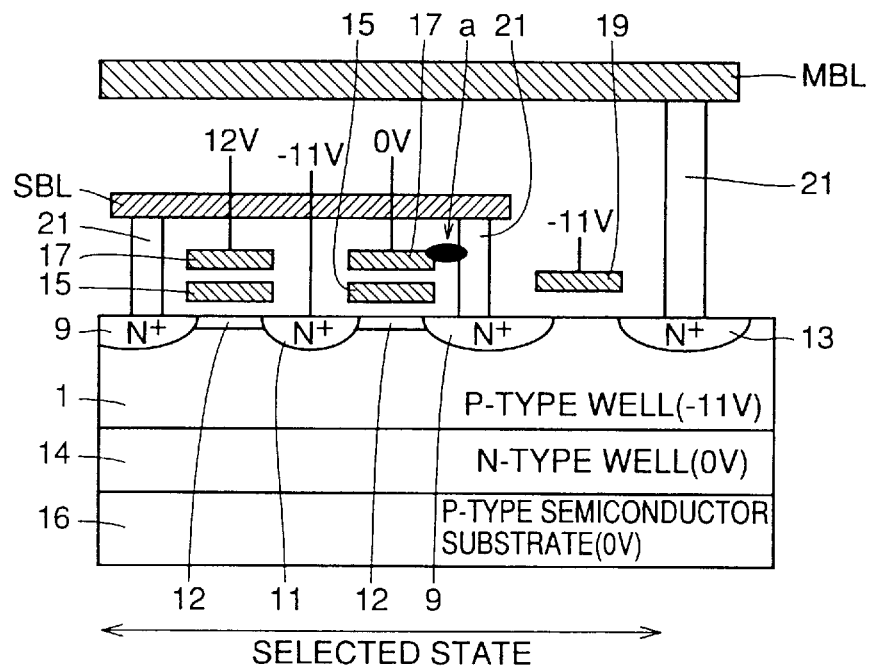
FIG. 18 shows the structure of the conventional DINOR flash memory provided with a block having a second defect (bit line-to-word line short-circuit) which is brought into a selected state.
Figure 19:
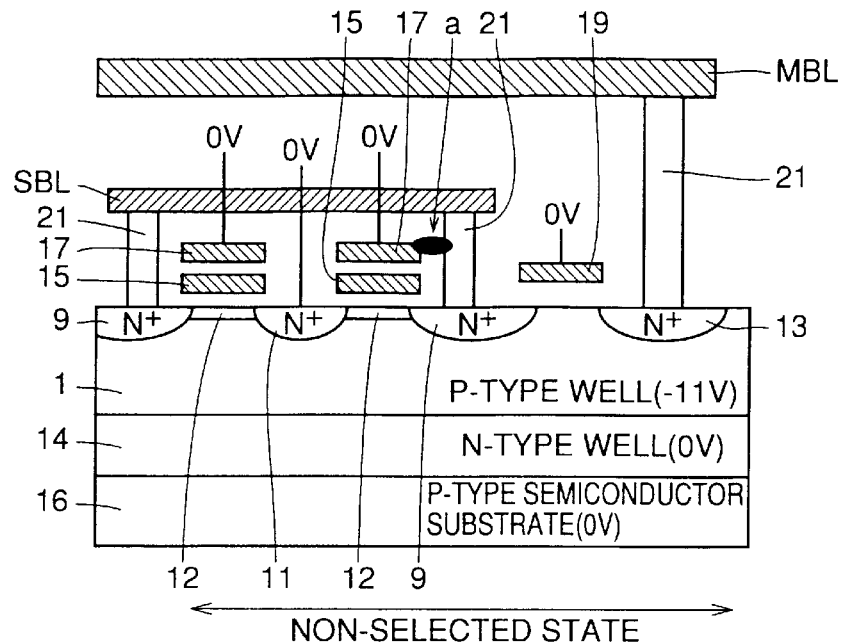
FIG. 19 shows the structure of the conventional DINOR flash memory provided with a block having a second defect (bit line-to-word line short-circuit) which is brought into a non-selected state.
Figure 20:
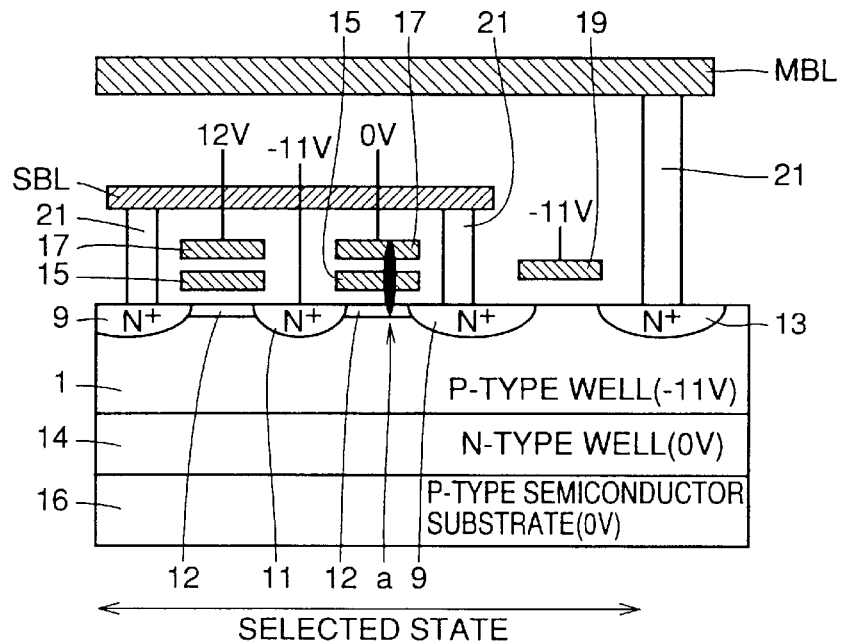
FIG. 20 shows the structure of the conventional DINOR flash memory provided with a block having a third defect (word line-to-well short-circuit) which is brought into a selected state.
Figure 21:
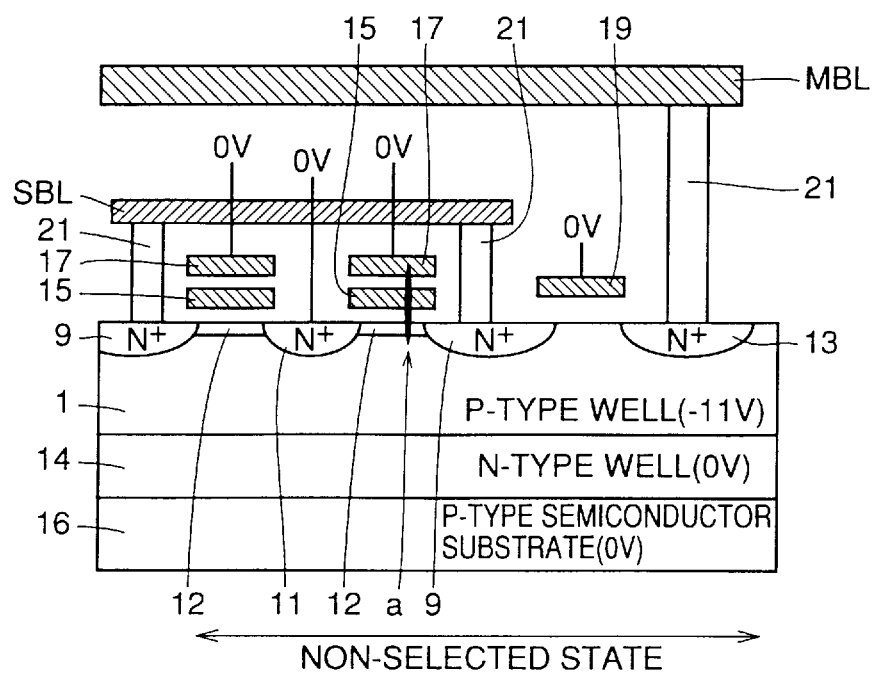
FIG. 21 shows the structure of the conventional DINOR flash memory provided with a block having a third defect (word line-to-well short-circuit) which is brought into a non-selected state.
Figures 22, 23:
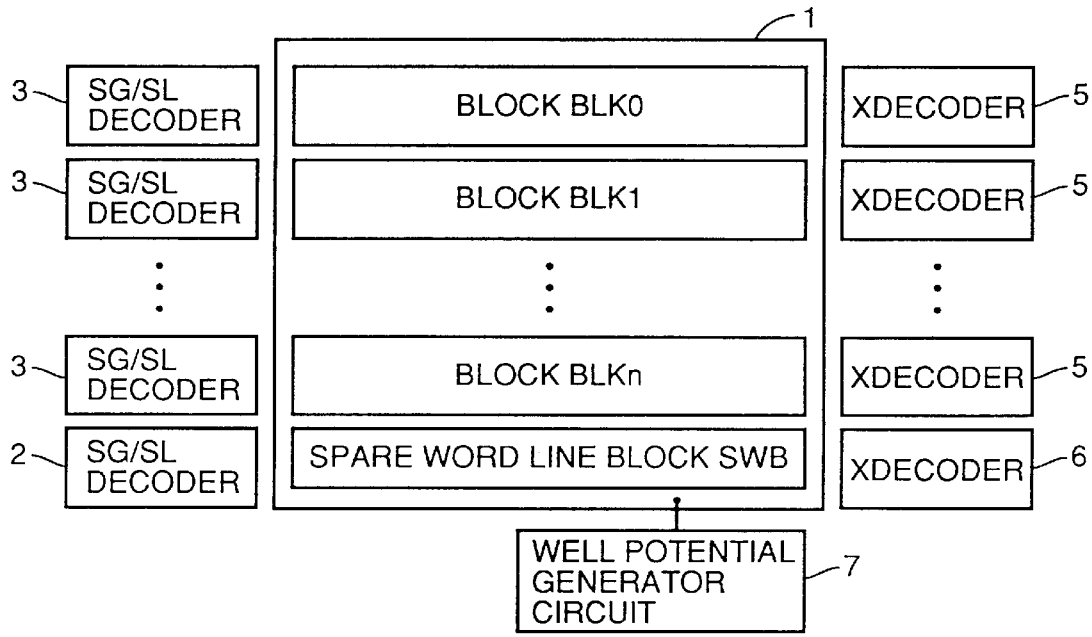
FIG. 22 is a schematic block diagram showing a principal part of the conventional DINOR flash memory.
FIG. 23 is adapted to illustrate methods of relieving defects in the conventional DINOR flash memory.

Each of the blocks BLK0 to BLKn is similar to the block BLK0 shown in FIG. 16. The blocks BLK0 to BLKn are identical in structure to each other, and have the same numbers of word lines (not shown) and memory cells (not shown). The spare block SB is also similar to the block BLK0 shown in FIG. 16. The spare block SB is identical in structure to the block BLK0 (FIG. 1), and has the same numbers of word lines (not shown) and memory cells (not shown). The spare word line block SWB is also similar to the block BLK0 shown in FIG. 16. This spare word line block SWB has a smaller number of word lines (not shown) than the block BLK0 (FIG. 1), and a small number of memory cells correspondingly. The word lines of the spare word line block SWB are referred to as "spare word lines". The memory cells included in the blocks BLK0 to BLKn, the spare block SB and the spare word line block SWB are stacked gate memory cells, which are similar in structure to those shown in FIG. 14.

The blocks BLK0 to BLKn are isolated from each other, the block BLKn is isolated from the spare block SB, and the spare block SB is isolated from the spare word line block SWB by selector transistors SG which are similar to those in FIG. 16 respectively. Namely, a main bit line MBL (not shown) is isolated from subbit lines SBL (not shown) of the blocks BLK0 to BLKn, the spare block SB and the spare word line block SWB by selector transistors SG which are similar to those in FIG. 16 respectively.

The well potential generator circuit 7 is similar to the well potential generator circuit 107 shown in FIG. 16. The X decoders 5, 6 and 8 are similar to those included in the X decoder group 101 shown in FIG. 16. The X decoders 5 are provided in correspondence to the blocks BLK0 to BLKn respectively, for selecting the word lines of the corresponding blocks respectively. The X decoder 8 is provided in correspondence to the spare block SB, for selecting the word lines of the spare block SB. The X decoder 6 is provided in correspondence to the spare word line block SWB, for selecting the spare word lines.

The SG/SL decoders 2, 3 and 4 include selector gate decoders (not shown) and source decoders (not shown) respectively. The source decoders are similar to the source decoder 89 shown in FIG. 16, and the selector gate decoders are similar to those included in the selector gate decoder group 103 shown in FIG. 16 respectively. The SG/SL decoders 3 are provided in correspondence to the blocks BLK0 to BLKn respectively. The SG/SL decoders 3 supply voltages to sources of the memory cell transistors (not shown) of the corresponding blocks and gates of the selector transistors SG (not shown) in response to an operation mode (erase, write or read operation). An erase, write or read operation is considered as the operation mode. The SG/SL decoder 4 is provided in correspondence to the spare block SB. This SG/SL decoder 4 supplies a voltage to sources of the memory cells (not shown) of the spare block SB and a gate of the selector transistor SG (not shown) in response to the operation mode. The SG/SL decoder 2 is provided in correspondence to the spare word line block SWB. This SG/SL decoder 2 supplies a voltage to sources of the memory cell transistors (not shown) of the spare word line block SWB and a gate of the selector transistor SG (not shown) in response to the operation mode.

FIG. 2 is adapted to illustrate methods of relieving defects in the DINOR flash memory according to the embodiment 1. Referring to FIGS. 1 and 2, a defective word line in any of the blocks BLK0 to BLKn is replaced with any spare word line in the spare word line block SWB when a first defect (word line-to-word line short-circuit) takes place. Thus, the first defect can be relieved. When a bit defect takes place, the word line which is connected with the defective memory cell in any of the blocks BLK0 to BLKn is replaced with any spare word line in the spare word line block SWB. Thus, the bit defect can be relieved.

When a second defect (bit line-to-word line short-circuit) takes place, on the other hand, the block in any of the blocks BLK0 to BLKn causing the second defect is brought into a non-selected state, and the spare block SB is selected. In other words, the block causing the second defect is replaced with the spare block SB. Thus, the second defect can be relieved. This is because the remaining normal blocks are not influenced by the second defect when the defective block having a defective word line is brought into a non-selected state. In the DINOR flash memory according to the embodiment 1, a third defect (word line-well short-circuit) cannot be relieved. The third defect results in a defective chip.

Figure 3:
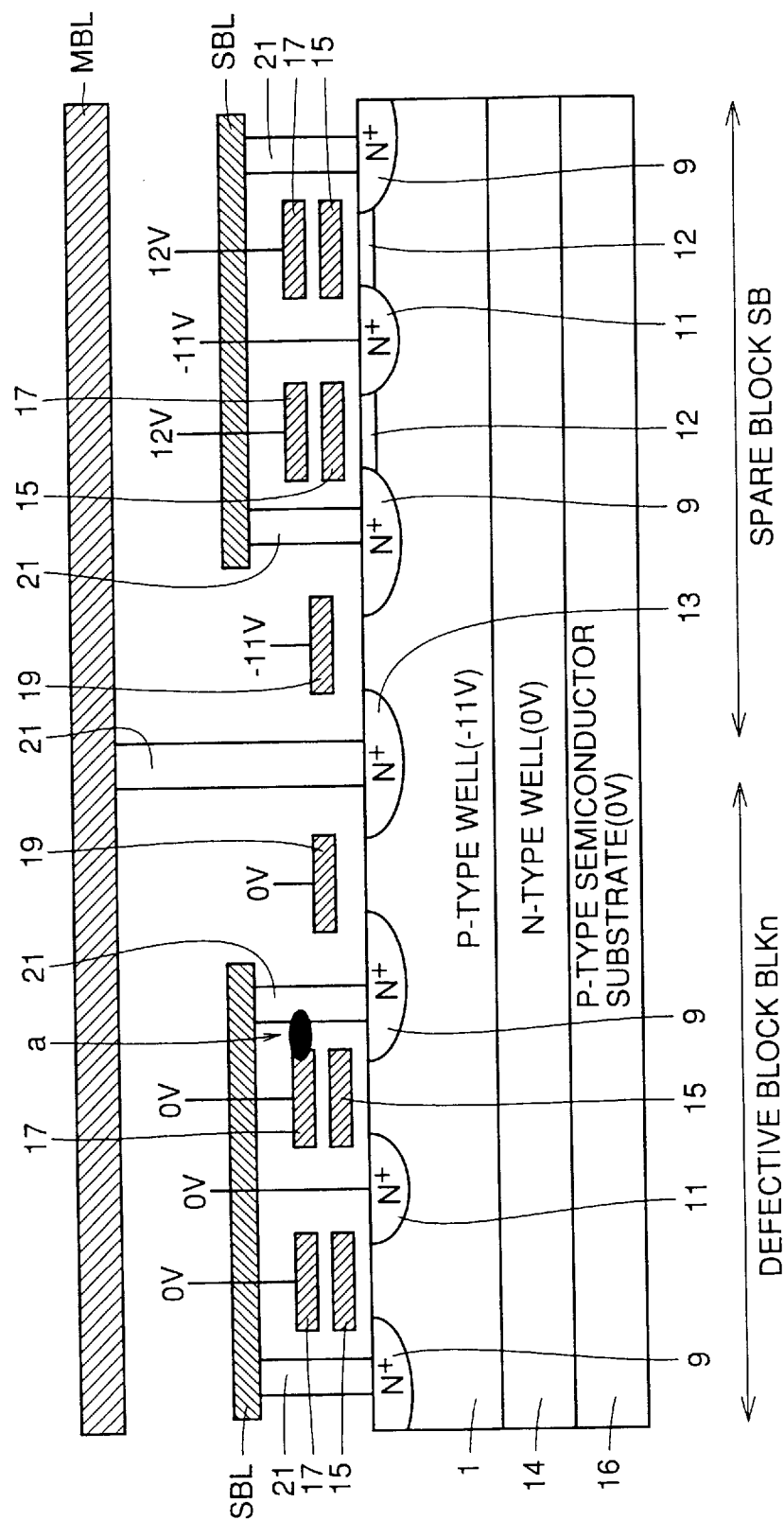
FIG. 3 is adapted to illustrate states of a defective block having a second defect (bit line-to-word line short-circuit) and a spare block for relieving the defective block respectively.
Figure 14:
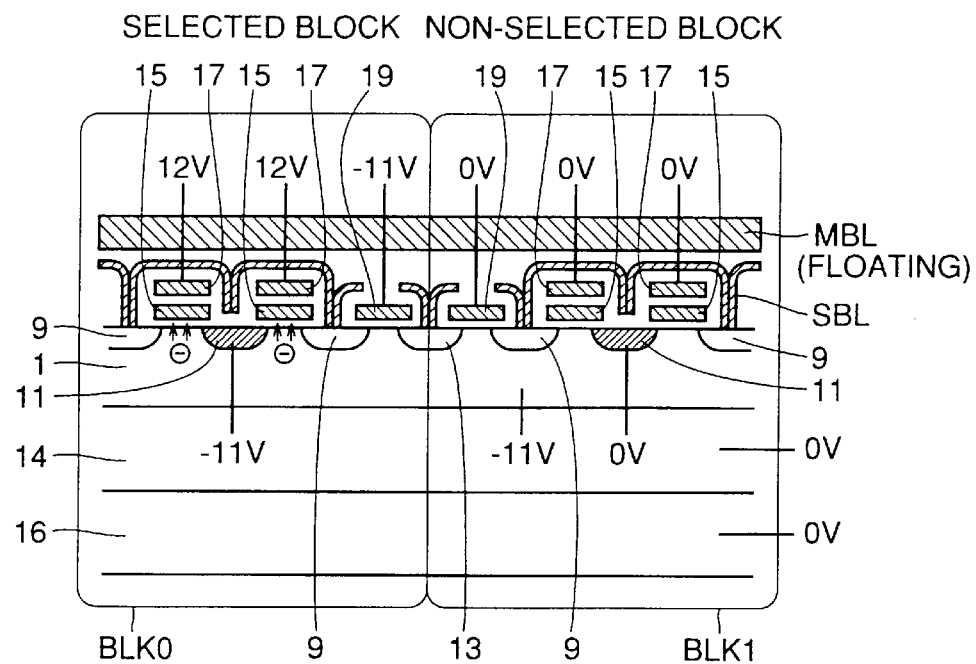
FIG. 14 is adapted to illustrate an erase operation in a conventional DINOR flash memory.

FIG. 3 is adapted to illustrate the states of the block (hereinafter referred to as a defective block) BLKn having a second defect (bit line-word line short-circuit) and the spare block SB for replacing the same respectively. Parts similar to those in FIG. 14 are denoted by the same reference numerals, to properly omit redundant description. Control gates 17, which are connected with the word lines (not shown), are referred to as word lines 17. The main bit line MB and an $N^+$ layer 13 are connected with each other through a conductive layer which is formed in a contact hole 21. The subbit lines SBL and $N^+$ layers 9 are connected with each other through conductive layers which are formed in contact holes 21.

Referring to FIG. 3, the second defect (bit line-to-word line short-circuit) takes place in the block BLKn, as shown by arrow a. When an address for selecting the defective block BLKn is inputted in erasing, the defective block BLKn is brought into a non-selected state, and the spare block SB is selected. In this case, the potentials of the word lines 17, an $N^+$ layer 11 serving as a source and a selector gate 19 of the defective block BLKn are 0 V. Such a state is referred to as a non-selected state. A voltage of 12 V is applied to the word lines 17 while a voltage of −11 v is applied to an $N^+$ layer 11 serving as a source and a selector gate 19 in the spare block SB. Such a state is referred to as a selected state in erasing. Thus, the defective block BLKn is replaced with the spare block SB. The defective block BLKn is regularly remains in the non-selected state, to exert no bad influence on the remaining blocks. A voltage of −11 V is applied to a P-type well 1, and voltage of 0 V is applied to an N-type well 14 and a P-type semiconductor substrate 16 respectively. In the spare block SB, memory cell transistors are turned on and channels 12 are formed.

Figure 4:
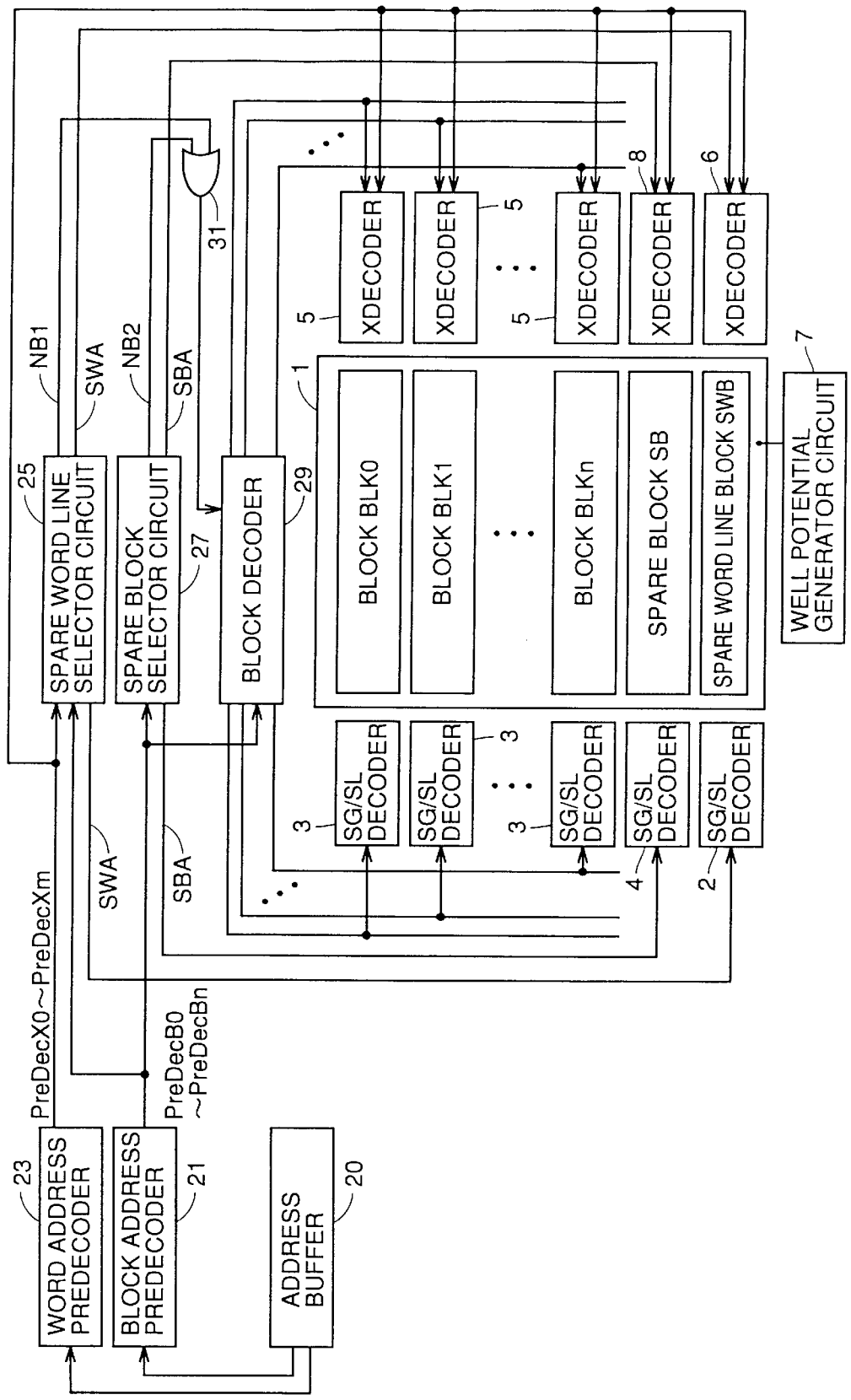
FIG. 4 is adapted to illustrate a method of replacing a defective block and a defective word line for relieving a defect in the DINOR flash memory according to the embodiment 1 of the present invention.

FIG. 4 is adapted to illustrate a method of replacing a defective block and a defective word line for relieving a defect in the DINOR flash memory according to the embodiment 1. Parts similar to those in FIG. 1 are denoted by the same reference numerals, to properly omit redundant description. Referring to FIG. 4, the DINOR flash memory according to the embodiment 1 comprises an address buffer 20, a block address predecoder 21, a word address predecoder 23, a spare word line selector circuit 25, a spare block selector circuit 27, a block decoder 29 and an OR circuit 31, in addition to the principal part shown in FIG. 1. The address buffer 20 receives an address signal from the exterior. The address buffer 20 supplies the word address predecoder 23 with an address (hereinafter referred to as "word address") for selecting a word line (not shown) in the blocks BLK0 to BLKn. Further, the address buffer 20 supplies the block address predecoder 21 with an address (hereinafter referred to as "block address") for selecting any of the blocks BLK0 to BLKn. The word address predecoder 23 supplies the spare word line selector circuit 25 and the X decoders 5, 6 and 8 with word address predecode signals PreDecX0 to PreDecXm obtained by predecoding the word address. Each of the blocks BLK0 to BLKn has m word lines, and the spare block SB also has $\underline{m}$ word lines. The number of the spare word lines provided in the spare word line block SWB is smaller than $\underline{m}$. The block address predecoder 21 supplies the spare word line selector circuit 25, the spare block selector circuit 27 and the block decoder 29 with block address predecode signals PreDecB0 to PreDecBn obtained by predecoding the block address.

When a block address predecode signal of a high level for selecting a defective block is inputted in the spare block selector circuit 27, the spare block selector circuit 27 supplies a high-level normal block inactivation signal NB1 to the OR circuit 31, while supplying a high-level spare block selection signal SBA to the X decoder 8 and the SG/SL decoder 4. The block decoder 29 receives a high-level signal outputted from the OR circuit 31, to be inactivated. Thus, all blocks BLK0 to BLKn are brought into and remain in non-selected states. In other words, the potentials of the word lines 17, the $N^+$ layers 11 serving as sources and the selector gates 19 are 0 V in all blocks BLK0 to BLKn (see FIG. 3). The X decoder 8 and the SG/SL decoder 4 receive the spare block selection signal SBA, and bring the spare block SB into a selected state. Namely, the SG/SL decoder 4 supplies a voltage of − 11 V to the selector gate 19 and the $N^+$ layer 11 serving as a source in the spare block SB in erasing (see FIG. 3). In erasing, further, the X decoder 8 supplies a voltage of 12 V to all word lines in the spare block SB (see FIG. 3).

When a high-level block address predecode signal for selecting a block causing a first defect and a high-level word address predecode signal for selecting a word line causing the first defect are inputted in the spare word line selector circuit 25, the spare word line selector circuit 25 supplies a high-level normal block inactivation signal NB1 to the OR circuit 31, while supplying a high-level spare word line selection signal SWA to the SG/SL decoder 2 and the X decoder 6. The block decoder 29 receives a high-level signal outputted from the OR circuit 31, to be inactivated. Thus, all blocks BLK0 to BLKn are brought into and remain in non-selected states. Namely, the potentials of all word lines 17, all N+ layers 11 serving as sources and all selector gates 19 are 0 V in the blocks BLK0 to BLKn. The SG/SL decoder 2 and the X decoder 6 receive the spare word line selection signal SWA, and bring the spare word line block SWB into a selected state. Namely, the SG/SL decoder 2 supplies a voltage to the selector gate 19 and the N+ layer 11 serving as a source in the spare block SB, and the X decoder 6 supplies a voltage to the word lines 17 in response to the operation mode (see FIG. 3). In writing, for example, the SG/SL decoder 2 supplies a voltage of 12 V to the selector gate 19 of the spare block SB and brings the N+ layer 11 serving as a source into a floating state, while the X decoder 6 supplies a voltage of −11 V to the word lines 17 in accordance with the word address predecode signal (see FIG. 3).

When neither a high-level block address predecode signal for selecting a block causing a first defect nor a high-level word address predecode signal for selecting a word line causing the first defect is inputted in the spare word line selector circuit 25 and no high-level block address predecode signal for selecting the defective block is inputted in the spare block selector circuit 27, the normal block inactivation signals NB1 and NB2 are at low levels. Therefore, the block decoder 29 selects one of the blocks BLK0 to BLKn in accordance with the block address predecode signal. The SG/SL decoder 3 corresponding to the block which is selected by the block decoder 29 supplies a voltage to the selector gate 19 and the N+ layer 11 serving as a source in the selected block in response to the operation mode (see FIG. 3). The X decoder 5 corresponding to the selected block applies a voltage of 12 V to all word lines 17 of the selected block in erasing, while supplying the voltage to the word lines 17 in accordance with the word address predecode signal in response to another mode. Thus, the selected block enters a selected state.

Figure 5:
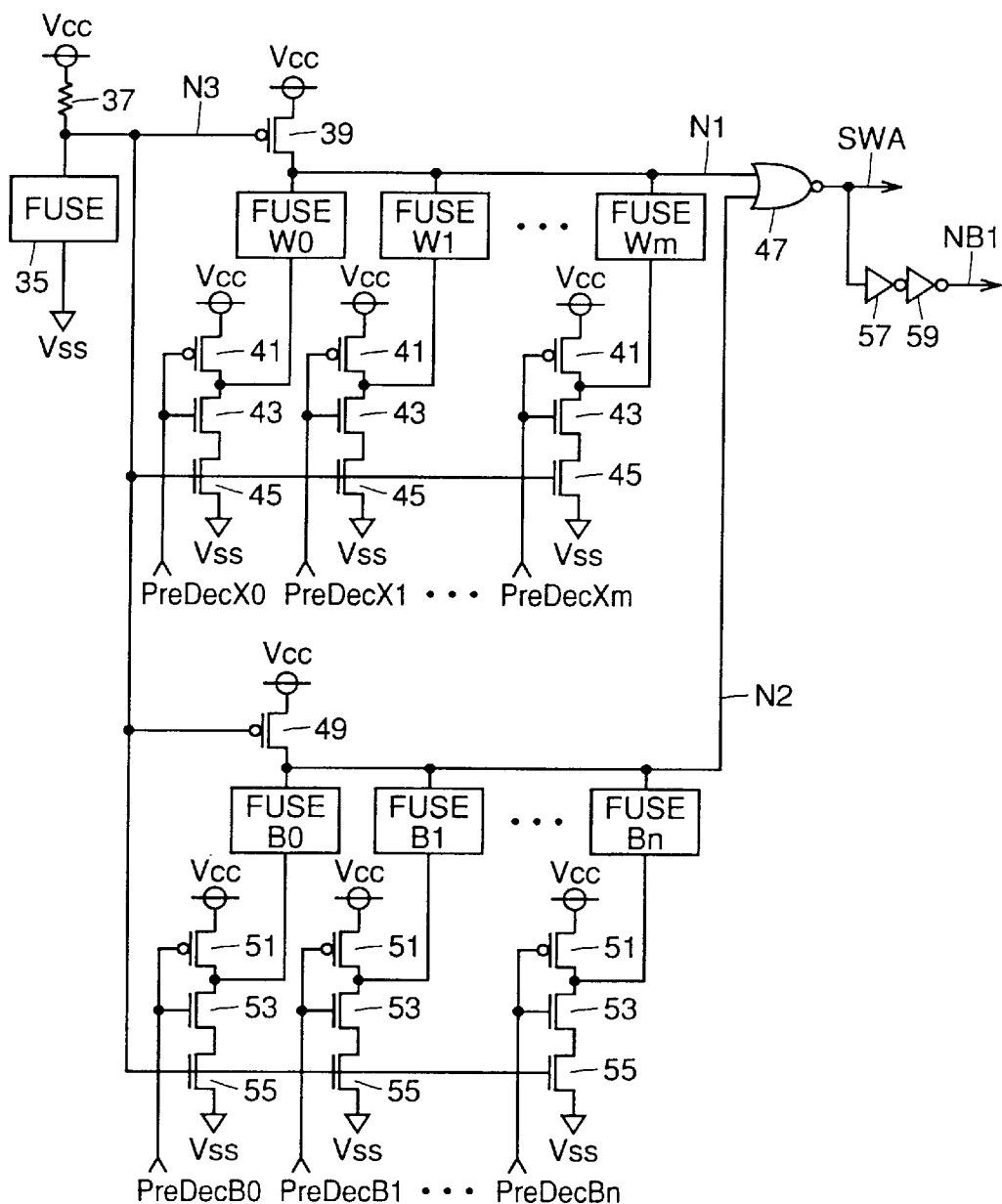
FIG. 5 is a circuit diagram showing a spare word line selector circuit shown in FIG. 4 in detail.

FIG. 5 is a circuit diagram showing the spare word line selector circuit 25 of FIG. 4 in detail. Referring to FIG. 5, the spare word line selector circuit 25 includes a resistive element 37, fuses 35, W0 to Wm and B0 to Bn, PMOS transistors 39, 41, 49 and 51, NMOS transistors 43, 45, 53 and 55, a NOR circuit 47, and invertors 57 and 59. The resistive element 37 is connected between a node having a source potential Vcc and a node N3. The fuse 35 is provided between the node N3 and a node having a ground potential Vss. The PMOS transistor 39 is provided between a node having the source potential Vcc and a node N1, and its gate is connected to the node N3. The PMOS transistors 41 and the NMOS transistors 43 and 45 are serially connected between nodes having the source potential Vcc and those having the ground potential Vss. Corresponding ones of the word address predecode signals PreDecX0 to PreDecXm are inputted in gates of the PMOS transistors 41 and the NMOS transistors 43 respectively. Gates of the NMOS transistors 45 are connected with the node N3. Corresponding ones of the fuses W0 to Wm are provided between the node N1 and drains of the PMOS transistors 41 respectively.

The PMOS transistor 49 is provided between a node having the source potential Vcc and a node N2, and its gate is connected to the node N3. The PMOS transistors 51 and the NMOS transistors 53 and 55 are serially connected between nodes having the source potential Vcc and those having the ground potential Vss. Corresponding ones of the block address predecode signals PreDecB0 to PreDecBn are inputted in gates of the PMOS transistors 51 and the NMOS transistors 53 respectively. Gates of the NMOS transistors 55 are connected with the node N3. Corresponding ones of the fuses B0 to Bn are provided between the node N2 and drains of the PMOS transistors 51 respectively. Input nodes of the NOR circuit 47 are connected with the nodes N1 and N2 respectively. An input node of the invertor 57 is connected to an output node of the NOR circuit 47. An input node of the invertor 59 is connected to an output node of the invertor 57. The NOR circuit 47 outputs the spare word line selection signal SWA. The invertor 59 outputs the normal block inactivation signal NB1 from its output node. The fuses W0 to Wm and B0 to Bn are made of polysilicon or the like.

In case of replacing a word line causing a first defect (hereinafter referred to as "defective word line") with a spare word line (the spare word line block SWB), the fuse 35 is blown. Only the fuse corresponding to the PMOS transistor 41 and the NMOS transistor 43 receiving a word address predecode signal corresponding to the word address for the defective word line is left to entirely blow the remaining fuses. In case of replacing a defective word line located at the word address corresponding to the word address predecode signal PreDecX0, for example, the fuse W0 is left and the remaining fuses W1 to Wm are entirely blown. Further, only the fuse corresponding to the PMOS transistor 51 and the NMOS transistor 53 receiving a block address predecode signal corresponding to the block address for the defective word line is left to entirely blow the remaining fuses. In case of replacing a defective word line located at the block address corresponding to the block address predecode signal PreDecB0, for example, only the fuse B0 is left and the remaining fuses B1 to Bn are entirely blown.

When a high-level word address predecode signal for selecting a defective word line is inputted, the PMOS transistor 41 and the NMOS transistor 43 receiving this word address predecode signal enter OFF and ON states respectively, due to the aforementioned setting of the fuses 35, W0 to Wm and B0 to Bn. Therefore, the node N1 is brought into a low level. Since the fuse 35 is blown, all NMOS transistors 45 are in ON states. When a high-level word address predecode signal other than that corresponding to the word address for the defective word line is inputted, the potential level of the node N1 is not influenced since the fuse corresponding to the PMOS transistor 41 and the NMOS transistor 43 receiving this word address predecode signal is entirely blown.

When a high-level block address predecode signal for selecting a block having a defective word line is inputted in the spare word line selector circuit 25, on the other hand, the PMOS transistor 51 and the NMOS transistor 53 receiving this block address predecode signal enter OFF and ON states respectively. When the high-level block address predecode signal for selecting the block for the defective word line is inputted, therefore, the node N2 is brought into a low level. Since the fuse 35 is blown, the PMOS transistor 49 and the NMOS transistors 55 are in OFF and ON states respectively. When a high-level block address predecode signal other than that corresponding to the block address for the defective word line is inputted, the potential level of the node N2 is not influenced since the fuse corresponding to the PMOS transistor 51 and the NMOS transistor 53 receiving this block address predecode signal is entirely blown.

As herein above described, the potentials of the nodes N1 and N2 are brought into low levels when a high-level word address predecode signal for selecting a defective word line and a high-level block address predecode signal for selecting the block having the defective word line are inputted in the spare word line selector circuit 25. Therefore, the spare word line selection signal SWA outputted from the NOR circuit 47 goes high. The normal block inactivation signal NB1 outputted from the invertor 59 also goes high. Thus, the block decoder 59 is inactivated, and all blocks BLK0 to BLKn are brought into non-selected states. Further, the spare word line block SWB is selected.

Figure 6:
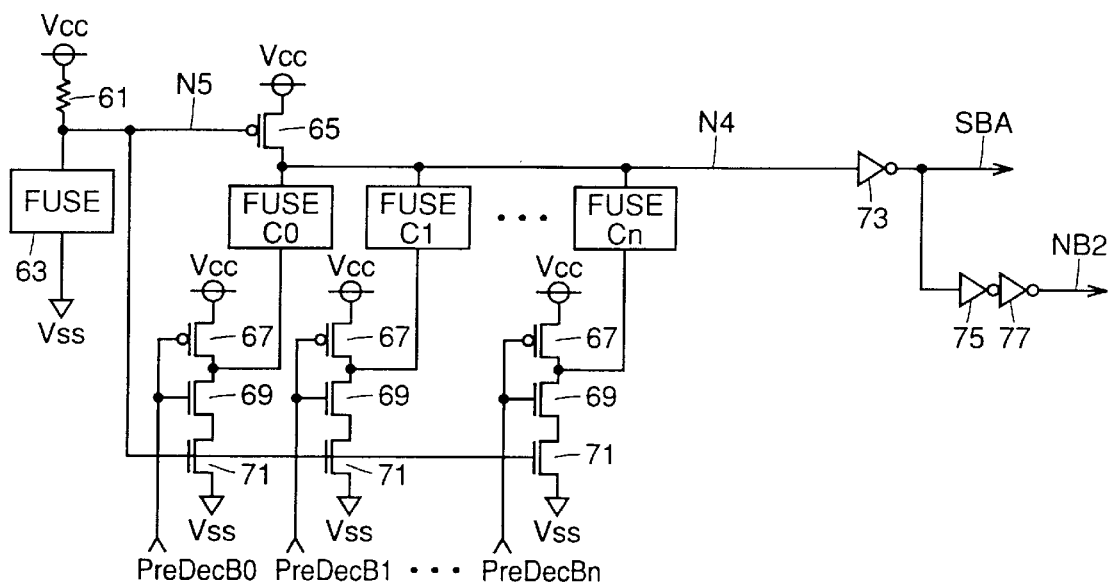
FIG. 6 is a circuit diagram showing a spare block selector circuit shown in FIG. 4 in detail.

FIG. 6 is a circuit diagram showing the spare block selector circuit 27 of FIG. 4 in detail. Referring to FIG. 6, the spare block selector circuit 27 includes a resistive element 61, fuses 63 and C0 to Cn, PMOS transistors 65 and 67, NMOS transistors 69 and 71, and invertors 73, 75 and 77. The resistive element 61 is provided between a node having the source potential Vcc and a node N5. The fuse 63 is provided between the node N5 and a node having the ground potential Vss. The PMOS transistor 65 is provided between a node having the source potential Vcc and a node N4, and its gate is connected to the node N5. The PMOS transistors 67 and the NMOS transistors 69 and 71 are serially connected between nodes having the source potential Vcc and those having the ground potential Vss. Corresponding ones of the block address predecode signals PreDecB0 to PreDecBn are inputted in gates of the PMOS transistors 67 and the NMOS transistors 69 respectively. Gates of the NMOS transistors 71 are connected with the node N5. Corresponding ones of the fuses C0 to Cn are provided between the node N4 and drains of the PMOS transistors 67 respectively. An input node of the invertor 73 is connected with the node N4. The invertor 73 outputs the spare block selection signal SBA. An input node of the invertor 75 is connected with an output node of the invertor 73. An input node of the invertor 77 is connected with an output node of the invertor 75. The invertor 77 outputs the normal block inactivation signal NB2. The fuses C0 to Cn are made of polysilicon or the like.

In case of replacing a defective block with the spare block SB, the fuse 63 is blown. Only the fuse corresponding to the PMOS transistor 67 and the NMOS transistor 69 receiving a block address predecode signal corresponding to the block address having the defective block is left to entirely blow the remaining fuses. In case of replacing a block located at a block address corresponding to the block address predecode signal PreDecB0, for example, the fuse C0 is left and the remaining fuses C1 to Cn are entirely blown. When a high-level block address predecode signal for selecting a defective block is inputted, the PMOS transistor 67 and the NMOS transistor 69 receiving this block address predecode signal enter OFF and ON states respectively, due to the aforementioned setting of the fuses 63 and C0 to Cn. Therefore, the drain of the PMOS transistor 67 receiving the high-level block address predecode signal for selecting the defective block and the node N4 are brought into low levels. Since the fuse 63 is blown, the PMOS transistors 65 and the NMOS transistors 71 are in OFF and ON states respectively.

When a high-level block address predecode signal other than that corresponding to the block address for the defective block line is inputted, the potential level of the node N4 is not influenced since the fuse corresponding to the PMOS transistor 67 receiving this block address predecode signal is blown. As herein above described, the node N4 is brought into a low level when a high level block address predecode signal for selecting a defective block is inputted in the spare block selector circuit 27, whereby the spare block selection signal SBA and the normal block inactivation signal NB2 go high. Due to the high-level normal block inactivation signal NB2, the block decoder 29 (FIG. 4) is inactivated, and all blocks BLK0 to BLKm are brought into non-selected states. The high-level spare block selection signal SWA brings the spare block SB into a selected state.

When a block address for selecting a block causing a second defect (bit line-to-word line short-circuit) is inputted in the DINOR flash memory according to the embodiment 1, all blocks BLK0 to BLKn including the defective block are brought into non-selected states while the spare block SB is selected, as herein above described. Therefore, a second defect caused in any block can be relieved. Further, a bit defect as well as a first defect can also be relieved with the spare word line block SWB. Consequently, the DINOR flash memory according to the embodiment 1 can improve the production yield, thereby preventing increase of the chip cost. The bit defect can be relieved similarly to the first defect.

(Embodiment 2)

Figure 15:
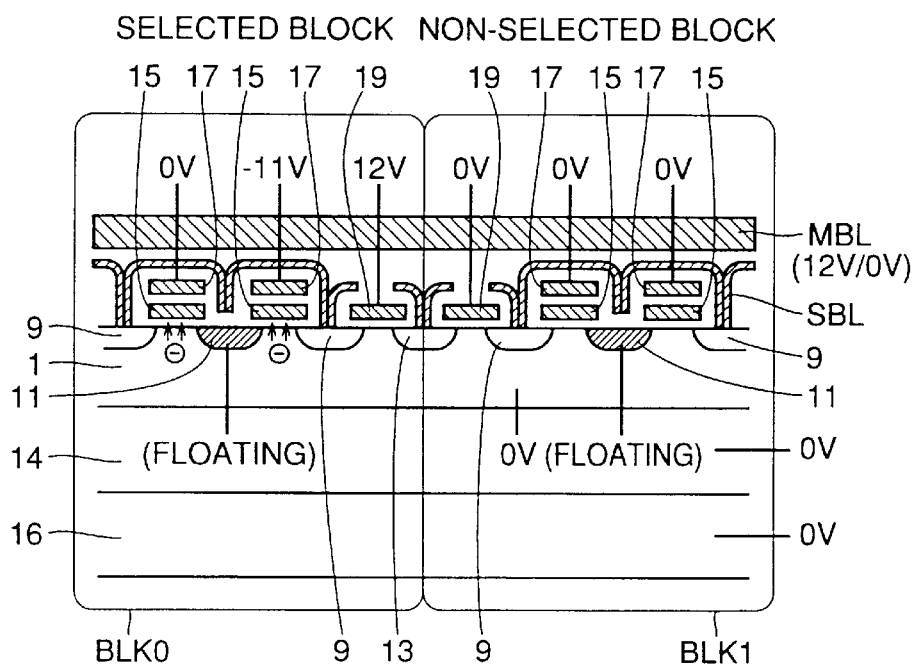
FIG. 15 is adapted to illustrate a write operation in the conventional DINOR flash memory.

A DINOR flash memory according to an embodiment 2 of the present invention can relieve a bit defect as well as first to third defects. The overall structure of the DINOR flash memory according to the embodiment 2 is similar to that shown in FIG. 16. An erase operation for memory cells of the DINOR flash memory according to the embodiment 2 is similar to that for the memory cells shown in FIG. 14. A write operation for the memory cells of the DINOR flash memory according to the embodiment 2 is similar to that for the memory cells shown in FIG. 15.

Figures 7, 8:
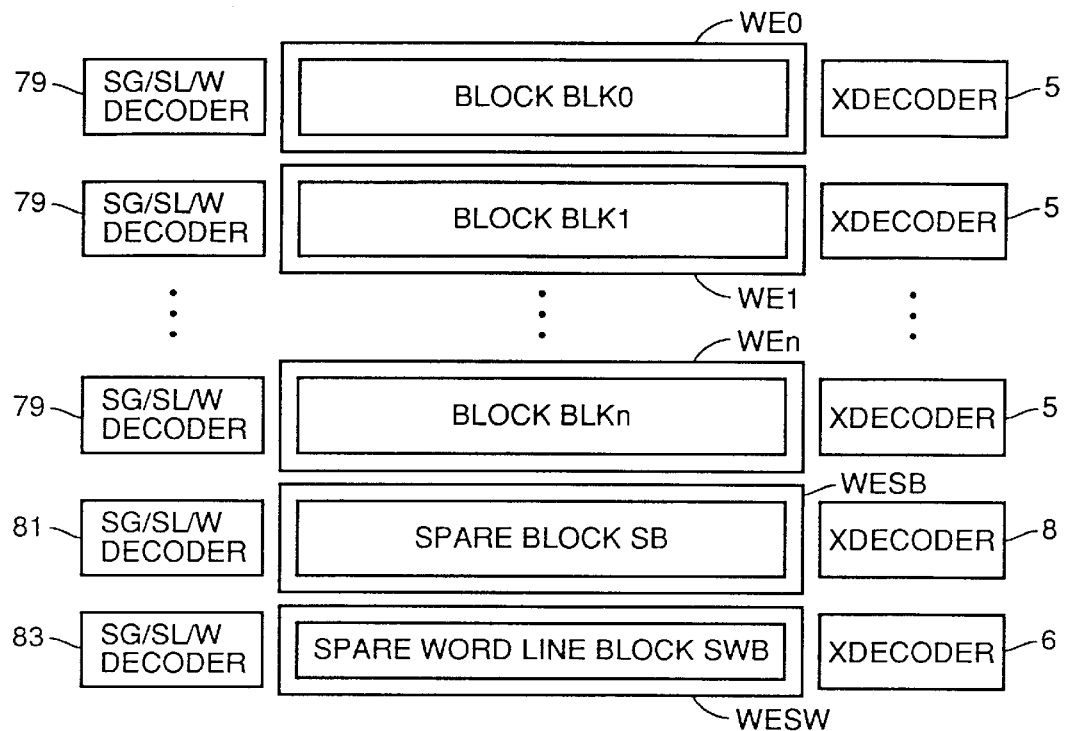
FIG. 7 is a schematic block diagram showing a principal part of a DINOR flash memory according to an embodiment 2 of the present invention.
FIG. 8 is adapted to illustrate methods of reliving defects in the DINOR flash memory according to the embodiment 2 of the present invention.

FIG. 7 is a schematic block diagram showing a principal part of the DINOR flash memory according to the embodiment 2. Parts similar to those in FIG. 1 are denoted by the same reference numerals, to properly omit redundant description. Blocks BLK0 to BLKn are formed on corresponding P-type wells WE0 to WEn respectively. The P-type wells WE0 to WEn are electrically isolated from each other. A spare block SB is formed on a corresponding P-type well WESB. This P-type well WESB is further electrically isolated from the P-type wells WE0 to WEn. A spare word line block SWB is formed on a corresponding P-type well WESW. This P-type well WESW is further electrically isolated from the P-type wells WE0 to WEn and WESB.

SG/SL/W decodes 79 are provided in correspondence to the blocks BLK0 to BLKm respectively. An SG/SL/W decoder 81 is provided in correspondence to the spare block SB. An SG/SL/W decoder 83 is provided in correspondence to the spare word line block SWB. The SG/SL/W decoders 79, 81 and 83 include selector gate decoders (not shown), source decoders (not shown) and well decoders (not shown). The selector gate decoders and the source decoders included in the SG/SL/W decoders 79, 81 and 83 are similar to those included in the SG/SL decoders 3, 4 and 2 shown in FIG. 1 respectively. The well decoders included in the SG/SL/W decoders 79 are adapted to supply voltages to the P-type wells provided with the corresponding blocks respectively in response to an operation mode (erase, write or read operation). When a corresponding block is selected in erasing, for example, each well decoder supplies a voltage of −11 V to the P-type well provided with this block. The well decoder of the SG/SL/W decoder 81 supplies a voltage to the P-type well WESB in response to the operation mode. When the spare block SB is selected in erasing, for example, this well decoder supplies a voltage of −11 V to the P-type well decoder WESB. The well decoder of the SG/SL/W decoder 83 supplies a voltage to the P-type well WESW in response to the operation mode. When the spare word line block SWB is selected in writing, for example, the well decoder supplies no voltage to the P-type well WESW but maintains its voltage at 0 V.

FIG. 8 is adapted to illustrate defect relieve methods in the DINOR flash memory according to the embodiment 2. Referring to FIG. 8, relieve methods for a first defect, a bit defect and a second defect are similar to the relieve methods (see FIG. 2) for the first defect, the bit defect and the second defect in the DINOR flash memory according to the embodiment 1. When a third defect (word line-to-well short-circuit) takes place, on the other hand, all blocks BLK0 to BLKn including that causing the third defect are brought into non-selected states, and the spare block SB is selected. In other words, the block causing the third defect is replaced with the spare block SB.

Figure 9:
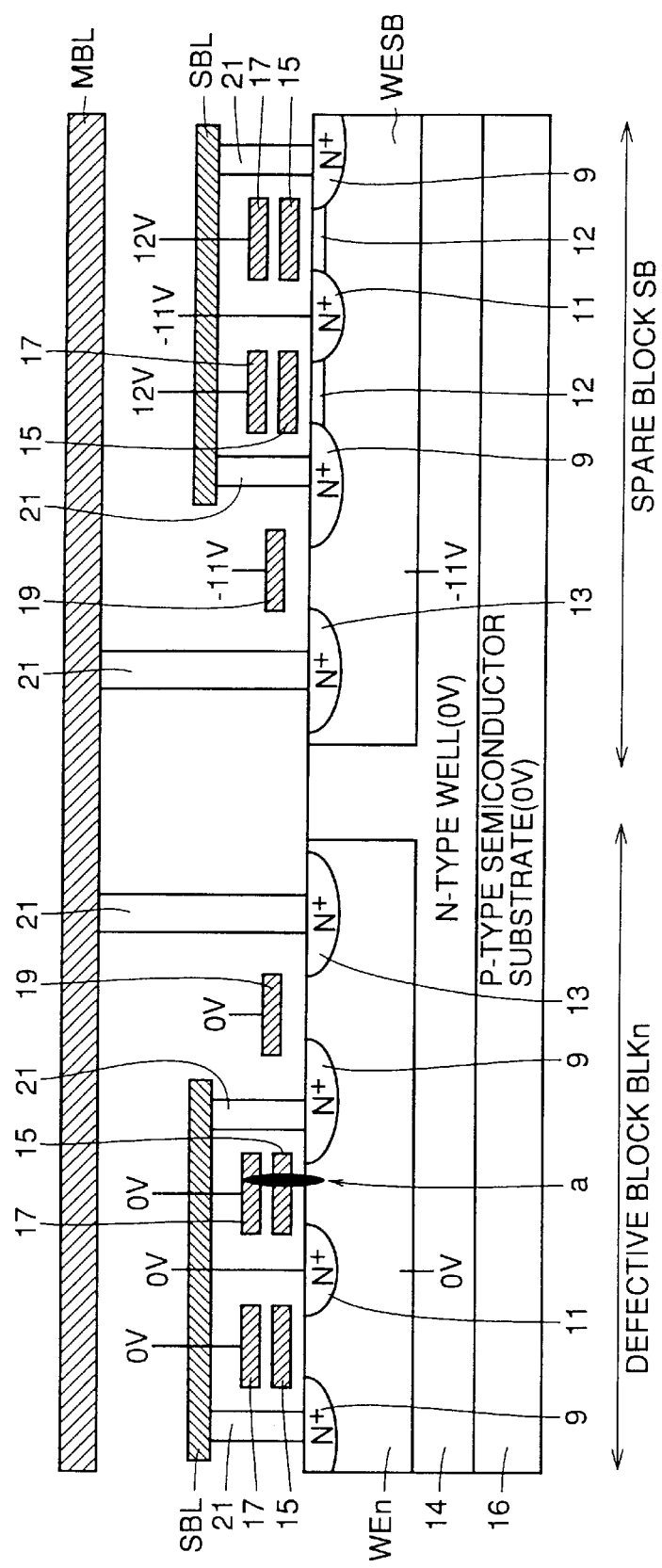
FIG. 9 is adapted to illustrate states of a defective block having a third defect (word line-to-well short-circuit) and a spare block for relieving the defective block respectively.

FIG. 9 is adapted to illustrate the states of the block having a third defect(hereinafter referred to as "defective block") BLKn and the spare block SB for relieving the third defect respectively. Parts similar to those in FIG. 3 are denoted by the same reference numerals, to properly omit redundant description.

Referring to FIG. 9, memory cells and a selector transistor of the block BLKn are formed on the P-type well WEn and those of the spare block SB are formed on the P-type well WESB respectively, while the P-type wells WEn and WESB are electrically isolated from each other. The memory cells include control gates 17 and floating gates 15, as well as $N^+$ layers 11 and 9 serving as sources and drains respectively. The selector transistors include selector gates 19 and $N^+$ layers 9 and 13. Further, the P-type wells WEn and WESB are formed on an upper layer of an N-type well 14 which is formed on a major surface of a P-type semiconductor substrate 16. This also applies to the remaining blocks and the spare word line block SWB.

A third defect (word line-to-well short-circuit) takes place in the block BLKn, as shown by arrow a. When a block address for selecting this defective block BLKn is inputted, all blocks BLK0 to BLKn including the defective block BLKn are brought into non-selected states. Namely, the potentials of the word lines 17, the $N^+$ layers 11 serving as sources, the P-type wells WE0 to WEn and the selector gates 19 of all blocks BLK0 to BLKn are 0 V. In erasing, a voltage of −11 V is applied to the selector gate 19 and the $N^+$ layer 11 of the spare block SB and the P-type well WESB, while a voltage of 12 V is applied to the word lines 17. Thus, the voltages supplied to the word lines 17 and the $N^+$ layer 11 serving as a source of the defective block BLKn and the P-type well WEn are 0 V when a block address for selecting this defective block BLK is inputted. Further, the P-type wells WEn and WESB are electrically isolated from each other. Therefore, no leakage based on the third defect takes place, voltage suppliability of a negative voltage generator circuit 111 (refer to FIG. 16) supplying the voltage (−11 V) to the selector gate 19 and the $N^+$ layer 11 serving as a source of the spare block SB and the P-type well WESB is not reduced, and the voltage of −11 V can be reliably generated.

Figure 10:
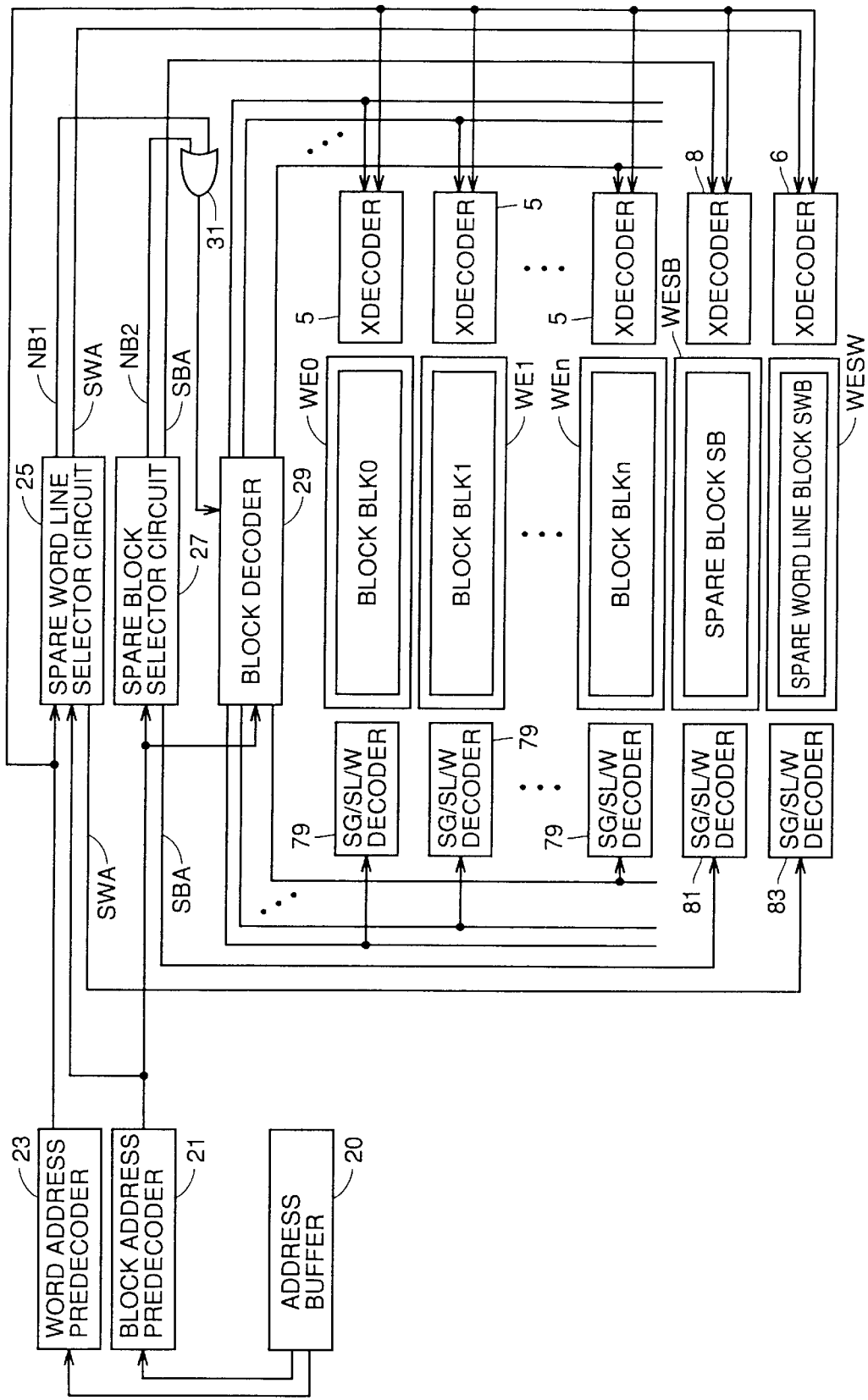
FIG. 10 is adapted to illustrate a method of replacing a defective block and a defective word line for relieving a defect in the DINOR flash memory according to the embodiment 2 of the present invention.

FIG. 10 is adapted to illustrate a method of relieving a defective block and a defective word line for relieving a defect in the DINOR flash memory according to the embodiment 2. Parts similar to those in FIGS. 7 and 4 are denoted by the same reference numerals, to properly omit redundant description. Referring to FIG. 10, the DINOR flash memory according to the embodiment 2 comprises an address buffer 20, a block address predecoder 21, a word address predecoder 23, a spare word line selector circuit 25, a spare block selector circuit 27, a block decoder 29 and an OR circuit 31, in response to the principal part shown in FIG. 7.

When a high-level block address predecode signal for selecting a block causing a third defect is inputted in the spare block selector circuit 27, a high-level normal block inactivation signal NB2 is supplied to the OR circuit 31, and a spare block selection signal SBA is supplied to the X decoder 8 and the SG/SG/W decoder 81. The block decoder 29 receives a high-level signal from the OR circuit 31, to be inactivated. Thus, all blocks BLK0 to BLKn are brought into non-selected states. Namely, the potentials of the P-type wells WE0 to WEn and the word lines 17, the $N^+$ layers 11 serving as sources and the selector gates 19 of the blocks BLK0 to BLKn remain at 0 V. The X decoder 8 and the SG/SL/W decoder 81 receive a spare block selection signal SBA, and bring the spare block SB into a selected state. In erasing, for example, the X decoder 8 supplies a voltage of 12 V to the word lines 17 of the spare block SB, and the SG/SL/W decoder 81 supplies a voltage of −11 V to the $N^+$ layer 11 serving as a source and the selector gate 19 of the spare block SB and the P-type well WESB. When a second defect takes place, the defective block is replaced by the same method as that for the third defect.

When a high-level block address predecode signal for selecting a block causing a first defect and a high-level word address predecode signal for selecting a word line causing the first defect are inputted in the spare word line selector circuit 25, the spare word line selector circuit 25 supplies the high-level normal block inactivation signal NB2 to the OR circuit 31, while supplying a spare word line selection signal SWA to the X decoder 6 and the SG/SL/W decoder 83. The block decoder 29 receives a high-level signal from the OR circuit 31, to be inactivated. Thus, all blocks BLK0 to BLKn are brought into non-selected states. Namely, the potentials of the word lines 17, the $N^+$ layers 11 serving as sources and the selector gates 19 of the blocks BLK0 to BLKn and the P-type wells WE0 to WEn remain at 0 V. The X decoder 6 and the SG/SL/W decoder 83 receive the spare word line selection signal SWA, and bring the spare word line block SWB into a selected state. Namely, the X decoder 6 supplies a voltage to a spare word line of the spare word line block SWB in response to the operation mode (erase, write or read operation). The SG/SL/W decoder 83 supplies a voltage to the $N^+$ layer 11 serving as a source and the selector gate 19 of the spare word line block SWB and the P-type well WESW in response to the operation mode. In writing, for example, the X decoder 6 supplies a voltage of −11 V to the spare word line in accordance with a word address predecode signal, while the SG/SL/W decoder 83 supplies a voltage of 12 V to the selector gate 19 of the spare word line block SWB. Also when a bit defect takes place, replacement similar to that for the first defect is performed.

When the spare word line selection signal SWA and the spare block selection signal SBA are at low levels, i.e., when neither a block address for selecting a defective block (including a block having a second defect) nor a word address for a defective word line is inputted, the block decoder 29 selects a block in accordance with the block address predecode signal. The X decoder 5 corresponding to the selected block applies a voltage to the word lines 17 of the selected block in accordance with the word address predecode signal in response to the operation mode. The SG/SL/W decoder 79 corresponding to the selected block supplies a voltage to the selector gate 19 and the $N^+$ layer 11 of the selected block and any of the P-type wells WE0 to WEn provided with the selected block in response to the operation mode. Consider that the block BLK1 has a third defect and the block BLK0 is selected, for example. In this case, the blocks BLK1 to BLKn are in non-selected states, and the word lines 17, the N⁺ layer 11 serving as a source and the selector gate 19 of the block BLK1 and the P-type well WE1 are supplied with a voltage of 0 V. Further, the P-type wells WE0 and WE1 provided with the selected block BLK0 and the block BLK1 having the third defect respectively are electrically isolated from each other. Therefore, no leakage results from the third defect of the block BLK1, and no bad influence is exerted on the block BLK0.

The spare word line selector circuit 25 is similar to that shown in FIG. 5, and its fuses are set in a similar manner to FIG. 5. The spare block selector circuit 27 is similar to that shown in FIG. 6, and its fuses are set in a similar manner to FIG. 6.

In the DINOR flash memory according to the embodiment 2, as hereinabove described, the P-type wells WE0 to WEn provided with the blocks BLK0 to BLKn are electrically isolated from each other, while the P-type well WESB provided with the spare block SB is further electrically isolated from the P-type wells WE0 to WEn and the P-type well WESW provided with the spare word line block SWB is further electrically isolated from the P-type wells WE0 to WEn and WESB. When a block address for selecting a block causing a third defect is inputted, all blocks BLK0 to BLKn are brought into non-selected states, while the spare block SB is selected. Therefore, a chip defect can be prevented even if a block causing a third defect is present. Further, a bit defect, a first defect and a second defect can also be relieved similarly to the DINOR flash memory according to the embodiment 1.

In the DINOR flash memory according to the embodiment 2, therefore, the production yield can be further improved as compared with the DINOR flash memory according to the embodiment 1, and increase of the chip cost can be prevented.

(Embodiment 3)

In each of the spare blocks SB shown in FIGS. 1 and 7, a first defect or a bit defect may be caused in any of the word lines in the spare block SB, due to the large number of memory cell transistors (not shown). Therefore, a DINOR flash memory according to an embodiment 3 of the present invention is enabled to relieve a bit defect and a first defect caused in a spare block SB. The overall structure and a principal part of the DINOR flash memory according to the embodiment 3 are similar to those of the DINOR flash memories shown in FIGS. 16 and 7.

Figure 11:
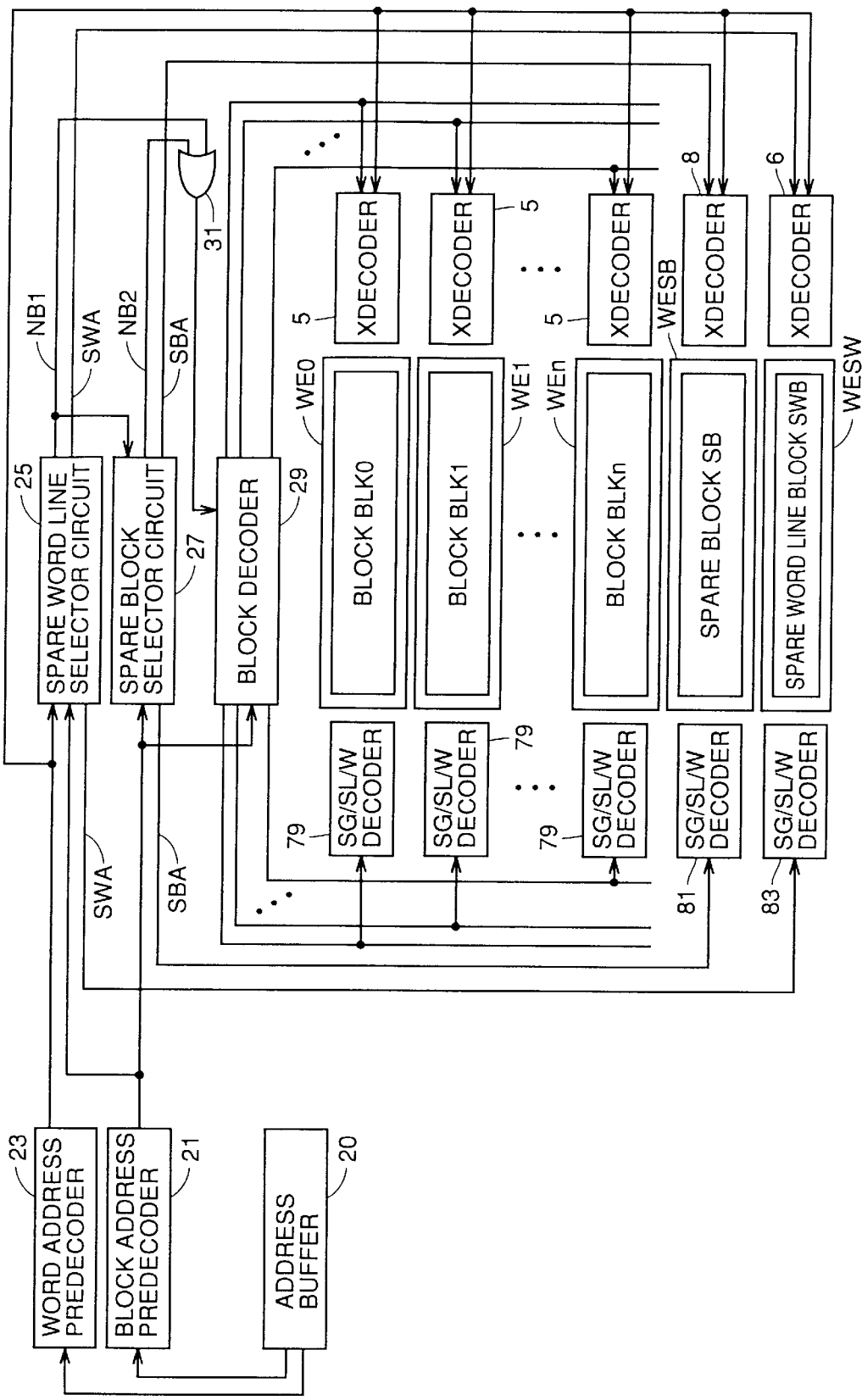
FIG. 11 is adapted to illustrate a method of replacing a defective block and a defective word line for relieving a defect in a DINOR flash memory according to an embodiment 3 of the present invention.

FIG. 11 is adapted to illustrate a method of replacing a defective word line for relieving a defect in the spare block SB of the DINOR flash memory according to the embodiment 3. Parts similar to those in FIG. 10 are denoted by the same reference numerals, to properly omit redundant description. Referring to FIG. 11, this embodiment is different from that shown in FIG. 10 in a point that a normal block inactivation signal NB1 from a spare word line selector circuit 25 is inputted in a spare block selector circuit 27. The spare word line selector circuit 25 is similar to that shown in FIG. 5.

Figure 12:
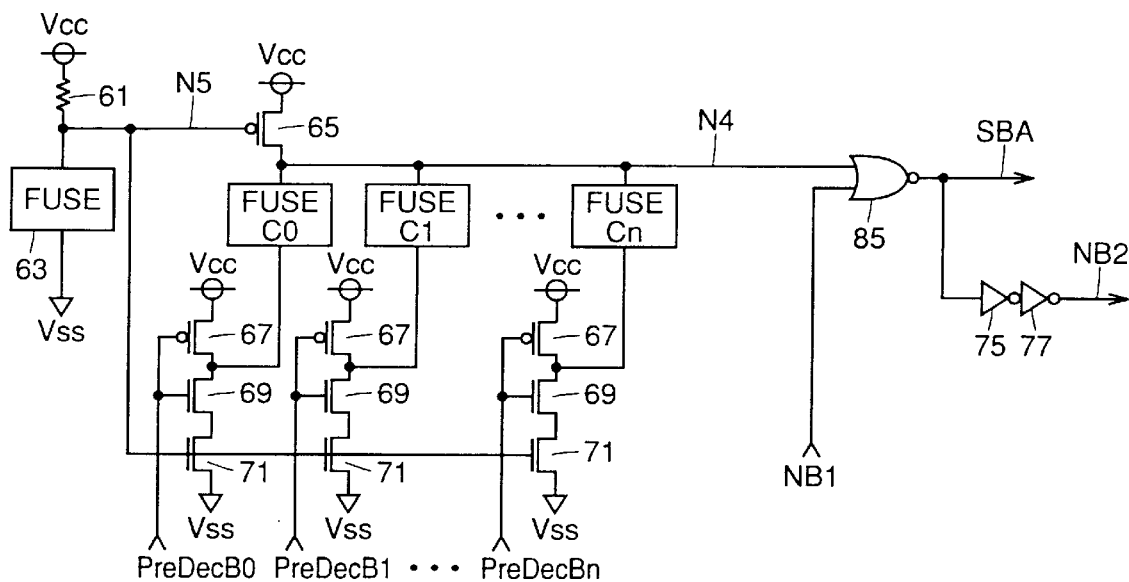
FIG. 12 is a circuit diagram showing a spare block selector circuit shown in FIG. 11 in detail.

FIG. 12 is a circuit diagram showing the spare block selector circuit 27 of FIG. 11 in detail. Parts similar to those in FIG. 6 are denoted by the same reference numerals, to properly omit redundant description. Referring to FIG. 12, the spare block selector circuit 27 employed in the DINOR flash memory according to the embodiment 3 is provided with a NOR circuit 85, in place of the invertor 73 shown in FIG. 6. An input node of the NOR circuit 85 is connected with a node N4, and another node is supplied with the normal block inactivation signal NB1 from the spare word line selector circuit 25.

With reference to FIGS. 11, 12 and 5, a method of replacing a word line causing a bit defect or a first defect in the spare block SB (hereinafter referred to as "defective word line") with a spare word line in a spare word line block SWB is now described. In case of replacing the defective word line with the spare word line, fuses W0 to Wn, B0 to Bn and C0 to Cn of the spare word line selector circuit 25 and the spare block selector circuit 27 are set as follows: The fuses B0 to Bn of the spare word line selector circuit 25 are set identically to the fuses C0 to Cn of the spare block selector circuit 27. Namely, only those of the fuses B0 to Bn and C0 to Cn corresponding to a block address predecode signal corresponding to a block address for the defective block is left to entirely blow the remaining fuses. When the block address predecode signal corresponding to the block address for the defective block is PreDecB0, for example, only the fuses C0 and B0 of the spare block selector circuit 27 and the spare word line selector circuit 25 are left and the remaining fuses C1 to Cn and B1 to Bn are entirely blown. The defective block is a block having a second or third defect.

In the fuses W0 to Wn of the spare word line selector circuit 25, only that corresponding to a word address predecode signal corresponding to a word address in the spare block SB having a defective word line is left to entirely blow the remaining fuses. When the word address predecode signal corresponding to the word address in the spare block SB having the defective word line is PreDecX0, for example, only the fuse W0 is left and the remaining fuses W1 to Wn are entirely blown.

Due to the aforementioned setting of the fuses W0 to Wn, B0 to Bn and C0 to Cn, the spare word line selector circuit 25 and the spare block selector circuit 27 operate as follows, to replace the defective word line in the spare block SB with the spare word line. It is assumed here that a block address for selecting a defective block and a word address for selecting a defective word line in the spare block SB are inputted. In this case, a block address predecode signal of a high level corresponding to the block address for the defective block is inputted in the spare block selector circuit 27, and hence a node N4 of the spare block selector circuit 27 is brought into a low level to select the spare block SB. However, the high-level normal block inactivation signal NB1 is inputted in the NOR circuit 85 for a reason described later, and hence a spare block selection signal SBA goes low, not to select the spare block SB.

A block address predecode signal of a high level corresponding to the block address for the defective block and a word address predecode signal of a high level corresponding to the word address in the spare block SB having the defective word line are inputted in the spare word line selector circuit 25, whereby potentials of nodes N1 and N2 of the spare word line selector circuit 25 go low while the spare word line selection signal SWA and the normal block inactivation signal NB1 go high respectively. Therefore, a block decoder 29 is inactivated, and all blocks BLK0 to BLKn are brought into non-selected states. Further, the spare word line block SWB is selected, so that the defective word line in the spare block SB is replaced with a spare word line in the spare word line block SWB.

FIG. 13 is adapted to illustrate the manners of replacement for relieving defects in the DINOR flash memory according to the embodiment 3. Referring to FIG. 13, a defective block is replaced with the spare block SB when only the fuses C0 to Cn of the spare block selector circuit 27 are set. Namely, when a block address predecode signal of a high level corresponding to a block address X for a defective block is inputted in the spare block selector circuit 27, the defective block located at the block address X is replaced with the spare block SB. Such replacement is similar to that in the DINOR flash memory according to the embodiment 2, and employed as a relieve method for a second or third defect.

Referring to FIG. 13, a word line having a defect (defective word line) is replaced with a spare word line when only the fuses W0 to Wn and B0 to Bn of the spare word line selector circuit 25 are set. Namely, when a block address predecode signal of a high level corresponding to a block address X for a defective word line and a word address predecode signal of a high level corresponding to a word address Y for the defective word line are inputted in the spare word line selector circuit 25, the word line located at the word address Y in the block located at the block address X is replaced with a spare word line in the spare word line block SWB. Such replacement is similar to that in the DINOR flash memory according to the embodiment 2, and employed as a relieve method for a bit or first defect.

Referring to FIG. 13, a defective word line in the spare block SB is replaced with a spare word line in the spare word line block SWB when the fuses W0 to Wn and B0 to Bn of the spare block selector circuit 27 and the fuses C0 to Cn of the spare block selector circuit 25 are simultaneously set. In this case, the fuses B0 to Bn of the spare word line selector circuit 25 must be set identically to the fuses C0 to Cn of the spare block selector circuit 27. Namely, when a block address predecode signal of a high level corresponding to a block address X for a defective block is inputted in the spare block selector circuit 27 while the block address predecode signal of a high level corresponding to the block address X for the defective block and a word address predecode signal of a high level corresponding to a word address Y of the spare block SB for the defective word line are inputted in the spare word line selector circuit 25, the word line located at the word address Y in the spare block SB is replaced with the spare word line in the spare word line block SWB.

In the DINOR flash memory according to the embodiment 3, as herein above described, a bit, first, second or third defect caused in any of the blocks BLK0 to BLKn can be relieved while a bit or first defect caused in the spare block SB can also be relieved. Consequently, the DINOR flash memory according to the embodiment 3 can further improve the production yield as compared with that according to the embodiment 2, thereby preventing increase of the chip cost.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A nonvolatile semiconductor memory device comprising:
a plurality of blocks each including a plurality of stacked gate memory cells; and
block selection means for selecting one said block in accordance with a block selection address,
said plurality of blocks being formed in a plurality of first conductivity type wells being electrically isolated from each other,
said nonvolatile semiconductor memory device further comprising:
well selection means responsive to an operation mode for supplying a voltage to one said well being provided with said block being selected by said block selection means; and
source selection means responsive to an operation mode for supplying a voltage to sources of said memory cells included in said block being selected by said block selection means.

2. The nonvolatile semiconductor memory device in accordance with claim 1, further comprising:
a first spare block being substantially in the same structure as said block, and
first spare block selection means for controlling said block selection means to select said first spare block when a block selection address for selecting defective said block is inputted so that said plurality of blocks are brought into non-selected states when said first spare block is selected,
said first spare block is formed on a well being further isolated from said plurality of wells, said well being of said first conductivity type,
said well selection means supplies a voltage to said well being provided with said first spare block in response to said operation mode when said first spare block is selected, and
said source selection means supplies a voltage to sources of stacked gate memory cells being included in said first spare block in response to said operation mode when said first spare block is selected.

3. The nonvolatile semiconductor memory device in accordance with claim 1, wherein each said block further includes a plurality of word lines being connected with corresponding said memory cells respectively,
said nonvolatile semiconductor memory device further comprises:
a second spare block including a smaller number of spare word lines than said plurality of word lines being included in each said block, and a plurality of stacked gate memory cells being connected with said spare word lines in the same mode as said memory cells being connected with said word lines, and
second spare block selection means for controlling said block selection means to select said second spare block when a block selection address and a word line selection address for selecting defective said word line are inputted so that said plurality of blocks are brought into non-selected states when said second spare block is selected,
said second spare block is formed on a well being further isolated from said plurality of wells being provided with said plurality of blocks, said well being of said first conductivity type,
said well selection means supplies a voltage to said well being provided with said second spare block in response to said operation mode when said second spare block is selected, and
said source selection means supplies a voltage to sources of said memory cells being included in said second spare block in response to said operation mode when said second spare block is selected.

4. The nonvolatile semiconductor memory device in accordance with claim 2, wherein each said block further includes a plurality of word lines being connected with corresponding said memory cells respectively, said nonvolatile semiconductor memory device further comprises:

a second spare block including a smaller number of spare word lines than said plurality of word lines being included in each said block, and a plurality of stacked gate memory cells being connected with said spare word lines in the same mode as said memory cells being connected with said word lines, and second spare block selection means for controlling said block selection means to select said second spare block when a block selection address and a word line selection address for selecting defective said word line are inputted so that said plurality of blocks are brought into non-selected states when said second spare block is selected, said second spare block is formed on a well being further isolated from said plurality of wells being provided with said plurality of blocks and said well being provided with said first spare block, said well being of said first conductivity type, said well selection means supplies a voltage to said well being provided with said second spare block in response to said operation mode when said second spare block is selected, said source selection means supplies a voltage to sources of said memory cells being included in said second spare block in response to said operation mode when said second spare block is selected, and said second spare block selection means controls said first spare block selection means to bring said first spare block into a non-selected state while selecting said second spare block when said block selection address for selecting said defective block and said word line selection address for selecting defective said word line in said first spare block are inputted.

5. The nonvolatile semiconductor memory device in accordance with claim 1, wherein said wells of said first conductivity type are formed on an upper layer of a second conductivity type well being formed on a major surface of a semiconductor substrate of the same conductivity type as said first conductivity wells.

6. The nonvolatile semiconductor memory device in accordance with claim 2, wherein said wells of said first conductivity type are formed on an upper layer of a second conductivity type well being formed on a major surface of a semiconductor substrate of the same conductivity type as said first conductivity wells.

7. The nonvolatile semiconductor memory device in accordance with claim 3, wherein said wells of said first conductivity type are formed on an upper layer of a second conductivity type well being formed on a major surface of a semiconductor substrate of the same conductivity type as said first conductivity wells.

8. The nonvolatile semiconductor memory device in accordance with claim 4, wherein said wells of said first conductivity type are formed on an upper layer of a second conductivity type well being formed on a major surface of a semiconductor substrate of the same conductivity type as said first conductivity wells.

9. The nonvolatile semiconductor memory device in accordance with claim 1, said device being of a NOR type.

10. The nonvolatile semiconductor memory device in accordance with claim 2, said device being of a NOR type.

11. The nonvolatile semiconductor memory device in accordance with claim 3, said device being of a NOR type.

12. The nonvolatile semiconductor memory device in accordance with claim 4, said device being of a NOR type.

* * * * *